(12) United States Patent
Besser

(10) Patent No.: US 6,368,967 B1
(45) Date of Patent: Apr. 9, 2002

(54) METHOD TO CONTROL MECHANICAL STRESS OF COPPER INTERCONNECT LINE USING POST-PLATING COPPER ANNEAL

(75) Inventor: Paul R. Besser, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/564,610

(22) Filed: May 4, 2000

(51) Int. Cl.⁷ .............................................. H01L 21/44
(52) U.S. Cl. ...................... 438/687; 438/687; 438/625; 438/653; 438/626; 438/630; 438/648
(58) Field of Search ................................. 438/687, 625, 438/653, 626, 630, 648, 637, 646, 586, 644, 685, 655

(56) References Cited

U.S. PATENT DOCUMENTS

| | | | |
|---|---|---|---|
| 5,789,315 A | | 8/1998 | Besser et al. ............... 438/624 |
| 5,817,572 A | * | 10/1998 | Chiang et al. .............. 438/624 |
| 5,939,788 A | * | 8/1999 | McTeer ...................... 257/751 |
| 6,037,257 A | * | 3/2000 | Chiang et al. .............. 438/687 |
| 6,110,819 A | * | 8/2000 | Colgan et al. .............. 438/625 |
| 6,168,704 B1 | * | 1/2001 | Brown et al. ............... 205/118 |
| 6,204,179 B1 | * | 3/2001 | McTeer ...................... 438/687 |
| 6,221,765 B1 | * | 4/2001 | Ueno .......................... 438/653 |
| 6,228,768 B1 | * | 5/2001 | Woo et al. .................. 438/691 |
| 6,245,672 B1 | * | 6/2001 | Hong et al. ................. 438/648 |

FOREIGN PATENT DOCUMENTS

JP         403190223 A  *  8/1991  ................. 438/102

* cited by examiner

Primary Examiner—Matthew Smith
Assistant Examiner—V. Yevsikov
(74) Attorney, Agent, or Firm—Williams, Morgan & Amerson

(57) ABSTRACT

A method is provided, the method comprising forming a first dielectric layer above a first structure layer, forming a first opening in the first dielectric layer, and forming a first copper structure above the first dielectric layer and in the first opening. The method also comprises annealing the first copper structure using one of a furnace anneal process performed at a temperature ranging from approximately 100–400° C. for a time ranging from approximately 10–90 minutes and a rapid thermal anneal (RTA) process performed at a temperature ranging from approximately 100–400° C. for a time ranging from approximately 10–180 seconds.

39 Claims, 20 Drawing Sheets

METHOD TO CONTROL MECHANICAL STRESS OF COPPER INTERCONNECT LINE USING POST-PLATING COPPER ANNEAL

BACKGROUND OF THE INVENTION

1. Field of the Invention

This invention relates generally to semiconductor fabrication technology, and, more particularly, to techniques for filling contact openings and vias with copper to create copper interconnections and lines.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires reducing the size and cross-sectional dimensions of electrical interconnects to contacts to active areas, such as $N^+$ ($P^+$) source/drain regions and a doped-polycrystalline silicon (doped-polysilicon or doped-poly) gate conductor, and the like. As the size and cross-sectional dimensions of electrical interconnects get smaller, resistance increases and electromigration increases. Increased resistance and electromigration are undesirable for a number of reasons. For example, increased resistance may reduce device drive current, and source/drain current through the device, and may also adversely affect the overall speed and operation of the transistor. Additionally, electromigration effects in aluminum (Al) interconnects, where electrical currents actually carry aluminum (Al) atoms along with the current, causing them to electromigrate, may lead to degradation of the aluminum (Al) interconnects, further increased resistance, and even disconnection and/or delamination of the aluminum (Al) interconnects.

The ideal interconnect conductor for semiconductor circuitry will be inexpensive, easily patterned, have low resistivity, and high resistance to corrosion, electromigration, and stress migration. Aluminum (Al) is most often used for interconnects in contemporary semiconductor fabrication processes primarily because aluminum (Al) is inexpensive and easier to etch than, for example, copper (Cu). However, because aluminum (Al) has poor electromigration characteristics and high susceptibility to stress migration, it is typical to alloy aluminum (Al) with other metals.

As discussed above, as semiconductor device geometries shrink and clock speeds increase, it becomes increasingly desirable to reduce the resistance of the circuit metallization. The one criterion that is most seriously compromised by the use of aluminum (Al) for interconnects is that of conductivity. This is because the three metals with lower resistivities (aluminum, Al, has a resistivity of $2.824 \times 10^{-6}$ ohms-cm at 20° C.), namely, silver (Ag) with a resistivity of $1.59 \times 10^{-6}$ ohms-cm (at 20° C.), copper (Cu) with a resistivity of $1.73 \times 10^{-6}$ ohms-cm (at 20° C.), and gold (Au) with a resistivity of $2.44 \times 10^{-6}$ ohms-cm (at 20° C.), fall short in other significant criteria. Silver (Ag), for example, is relatively expensive and corrodes easily, and gold (Au) is very costly and difficult to etch. Copper (Cu), with a resistivity nearly on par with silver (Ag), a relatively high immunity to electromigration, high ductility and high melting point (1083° C. for copper, Cu, vs. 660° C. for aluminum, Al), fills most criteria admirably. However, copper (Cu) is difficult to etch in a semiconductor environment. As a result of the difficulty in etching copper (Cu), an alternative approach to forming vias and metal lines must be used. The damascene approach, consisting of etching openings such as trenches in the dielectric for lines and vias and creating in-laid metal patterns, is the leading contender for fabrication of sub-0.25 micron (sub-0.25$\mu$) design rule copper-metallized (Cu-metallized) circuits.

However, even with copper (Cu) interconnects, high mechanical stress levels in the copper (Cu) interconnects and lines may (1) give rise to the formation of stress-induced voids, and (2) decrease the reliability of the copper (Cu) interconnects and lines, both of which effects are undesirable. Typically, mechanical stress levels in aluminum (Al) interconnects and lines are controlled by adjusting the deposition temperature of a subsequently deposited interlevel (or interlayer) dielectric (ILD) layer. For example, as described in U.S. Letters Patent No. 5,789,315, entitled "Eliminating Metal Extrusions By Controlling the Liner Deposition Temperature," issued Aug. 4, 1998, assigned by the inventors Paul R. Besser et al. to Advanced Micro Devices, Inc., the assignee of the present application, hereby incorporated in its entirety by reference herein, as if set forth below, the deposition temperature of a conformal dielectric layer is controlled relative to a subsequent degas temperature, thereby lowering thermal compressive stresses in previously formed aluminum (Al) interconnects and lines.

Mechanical stresses in metallic interconnects and lines typically arise from the difference in thermal expansion between the metallic interconnects and lines, on the one hand, and the underlying and/or adjacent semiconducting substrate and/or dielectric layer(s), on the other hand, which rigidly confine the metallic interconnects and lines. The magnitude of the mechanical stress can be determined using X-ray diffraction (XRD) techniques. The aluminum (Al) interconnects and lines are typically produced by patterning blanket-deposited films using known photolithographic patterning techniques and a subtractive etching process, such as a reactive ion etch (RIE) process. When the aluminum (Al) interconnects and lines are subsequently heated to the temperature (typically about 400° C.) at which the passivation layer, such as an interlayer dielectric (ILD) layer is deposited, the mechanical stress state of the aluminum (Al) interconnects and lines is small or effectively zero. After deposition of the passivation layer, large hydrostatic (or isotropic) mechanical stresses in the aluminum (Al) interconnects and lines develop as the aluminum (Al) tries to contract more than the adjacent passivation layer and/or the underlying semiconducting substrate will permit.

The mechanical stresses in the aluminum (Al) interconnects and lines behave linearly with temperature, since normal plastic deformation cannot relieve a hydrostatic mechanical stress. The mechanical stresses in the aluminum (Al) interconnects and lines are larger than the aluminum (Al) yield mechanical stresses, but cannot be relieved by simple plastic deformation mechanisms since the aluminum (Al) interconnects and lines are under hydrostatic tensile mechanical stresses. For aluminum (Al) interconnects and lines, mechanical stress-induced voiding has been observed as one way that these large mechanical stresses get relieved. Consequently, such mechanical stress-induced voiding is a reliability concern for aluminum (Al) interconnects and lines.

As described above, damascene-fabricated copper (Cu) may be used to replace aluminum (Al) as the interconnect metallization for high-performance logic technologies as critical dimensions approach about 0.22 microns ($\mu$m) and 0.18 microns ($\mu$m), and smaller. This is due, in part, to the higher conductivity, improved electromigration performance and reduced cost of manufacturing of damascene-fabricated copper (Cu). As was the experience with aluminum (Al), the fabrication method strongly influences the mechanical stress state. As described above, even with copper (Cu) interconnects, high mechanical stress levels in the copper (Cu) interconnects and lines may (1) give rise to the formation of stress-induced voids, and (2) decrease the reliability of the copper (Cu) interconnects and lines, both of which effects are undesirable. Consequently, there is a need to better control and reduce mechanical stress level in copper (Cu) interconnects and lines used in integrated circuits.

The present invention is directed to overcoming, or at least reducing the effects of, one or more of the problems set forth above.

SUMMARY OF THE INVENTION

In one aspect of the present invention, a method is provided, the method comprising forming a first dielectric layer above a first structure layer, forming a first opening in the first dielectric layer, and forming a first copper structure above the first dielectric layer and in the first opening. The method also comprises annealing the first copper structure using one of a furnace anneal process performed at a temperature ranging from approximately 100–400° C. for a time ranging from approximately 10–90 minutes and a rapid thermal anneal (RTA) process performed at a temperature ranging from approximately 100–400° C. for a time ranging from approximately 10–180 seconds.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
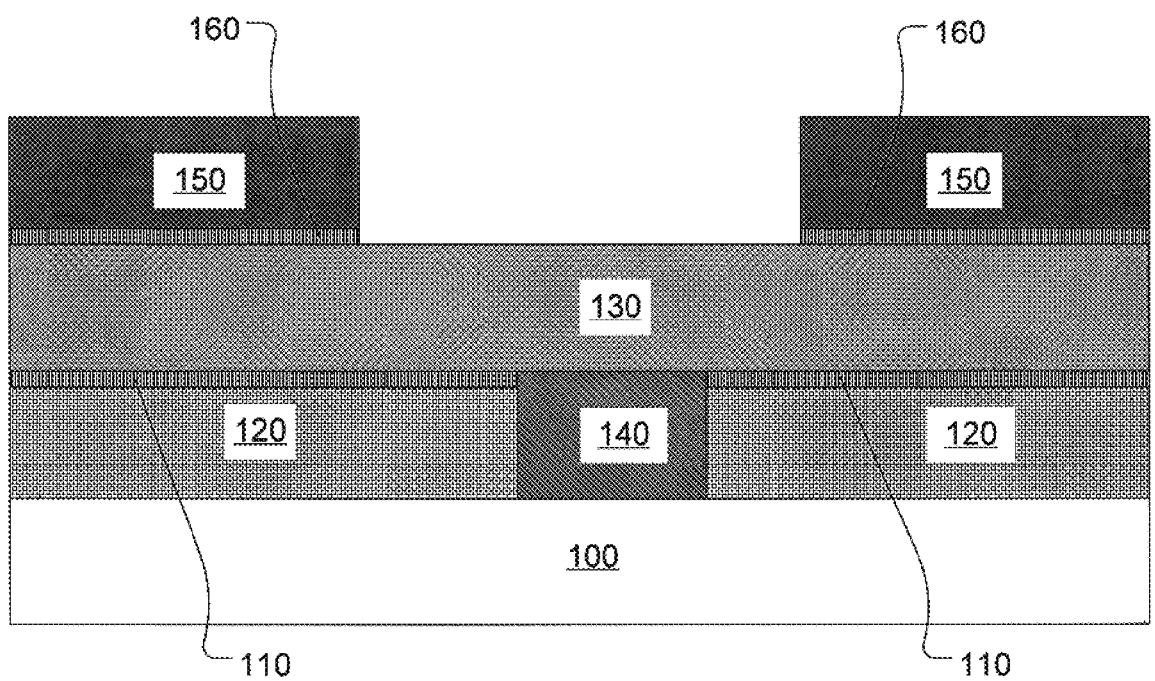
FIGS. 1–8 schematically illustrate a single-damascene copper interconnect process flow according to various embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 1–20. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

As shown in FIG. 1, a first dielectric layer 120 and a first conductive structure 140 (such as a copper intermetal via connection) may be formed above a structure layer 100 such as a semiconducting substrate. However, the present invention is not limited to the formation of a copper (Cu)-based interconnect above the surface of a semiconducting substrate such as a silicon wafer, for example. Rather, as will be apparent to one skilled in the art upon a complete reading of the present disclosure, a copper (Cu)-based interconnect formed in accordance with the present invention may be formed above previously formed semiconductor devices and/or process layer, e.g., transistors, or other similar structure. In effect, the present invention may be used to form process layers on top of previously formed process layers. The structure layer 100 may be an underlayer of semiconducting material, such as a silicon substrate or wafer, or, alternatively, may be an underlayer of semiconductor devices (see FIG. 10, for example), such as a layer of metal oxide semiconductor field effect transistors (MOSFETs), and the like, and/or a metal interconnection layer or layers (see FIG. 9, for example) and/or an interlevel (or interlayer) dielectric (ILD) layer or layers, and the like.

In a single-damascene copper process flow, according to various embodiments of the present invention, as shown in FIGS. 1–8, the first dielectric layer 120 is formed above the structure layer 100, adjacent the first conductive structure 140. As shown in FIG. 1, the first dielectric layer 120 has an etch stop layer (ESL) 110 (typically silicon nitride, $Si_3N_4$, or SiN, for short) formed and patterned thereon, between the first dielectric layer 120 and a second dielectric layer 130 and adjacent the first conductive structure 140. The second dielectric layer 130 is formed above the etch stop layer (ESL) 110 and above the first conductive structure 140. The first dielectric layer 120 has the first conductive structure 140 disposed therein. If necessary, the second dielectric layer 130 may have been planarized using a chemical-mechanical polishing (CMP) process. The second dielectric layer 130 has an etch stop layer 160 (typically also SiN) formed and patterned thereon, between the second dielectric layer 130 and a patterned photomask 150. The patterned photomask 150 is formed and patterned above the etch stop layer 160.

The first and second dielectric layers 120 and 130 may be formed from a variety of dielectric materials, including, but not limited to, materials having a relatively low dielectric constant (low K materials, where K is less than or equal to about 4). The first and second dielectric layers 120 and 130 may be formed by a variety of known techniques for forming such layers, e.g., a chemical vapor deposition (CVD) process, a low-pressure CVD (LPCVD) process, a plasma-enhanced CVD (PECVD) process, a sputtering process, a physical vapor deposition (PVD) process, a spin-on coating process (such as a spin-on glass process), and the like, and each may have a thickness ranging from approximately 3000 Å–8000 Å, for example.

The first and second dielectric layers 120 and 130 may be formed from a variety of low K dielectric materials, where K is less than or equal to about 4. Examples include Applied Material's Black Diamond®, Novellus' Coral®, Allied Signal's Nanoglass®, JSR's LKD5104, and the like. In one illustrative embodiment, the first and second dielectric layers 120 and 130 are each comprised of Applied Material's Black Diamond®, each having a thickness of approximately 5000 Å, each being formed by being blanket-deposited by an LPCVD process for higher throughput.

Figure 2:
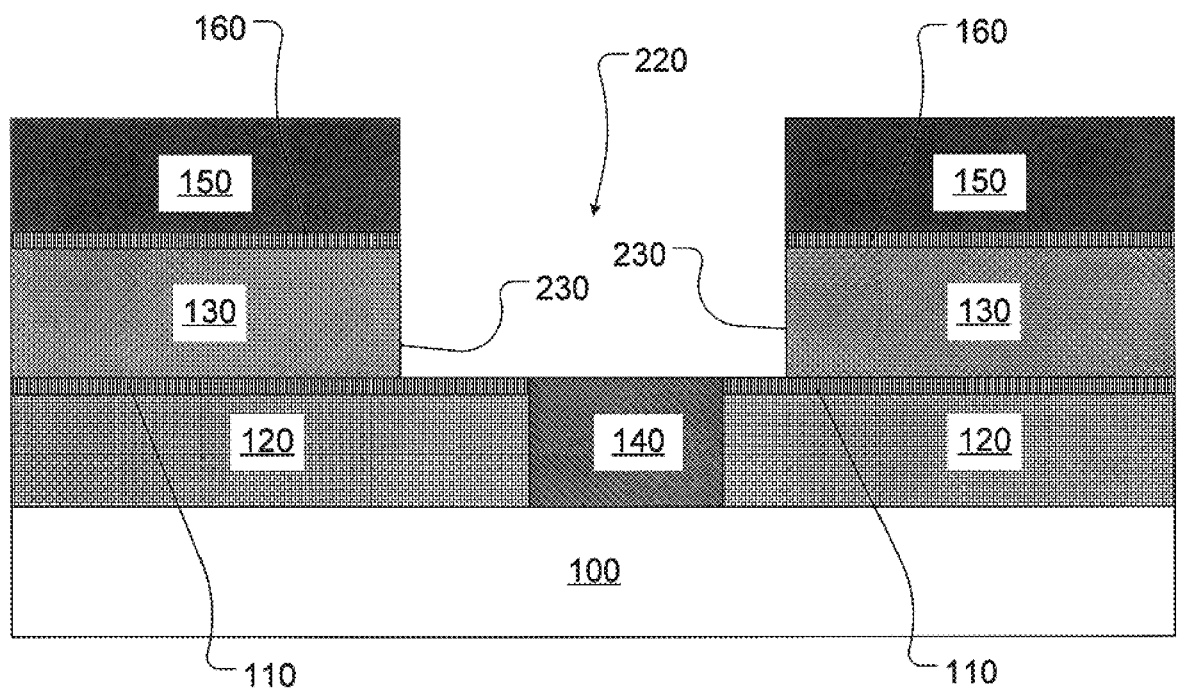

As shown in FIG. 2, a metallization pattern is then formed by using the patterned photomask 150, the etch stop layers 160 and 110 (FIGS. 1–2), and photolithography. For example, openings (such as an opening or trench 220 formed above at least a portion of the first conductive structure 140) for conductive metal lines, contact holes, via holes, and the like, are etched into the second dielectric layer 130 (FIG. 2). The opening 220 has sidewalls 230. The opening 220 may be formed by using a variety of known anisotropic etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used in various illustrative embodiments. The etching may stop at the etch stop layer 110 and at the first conductive structure 140.

Figure 3:
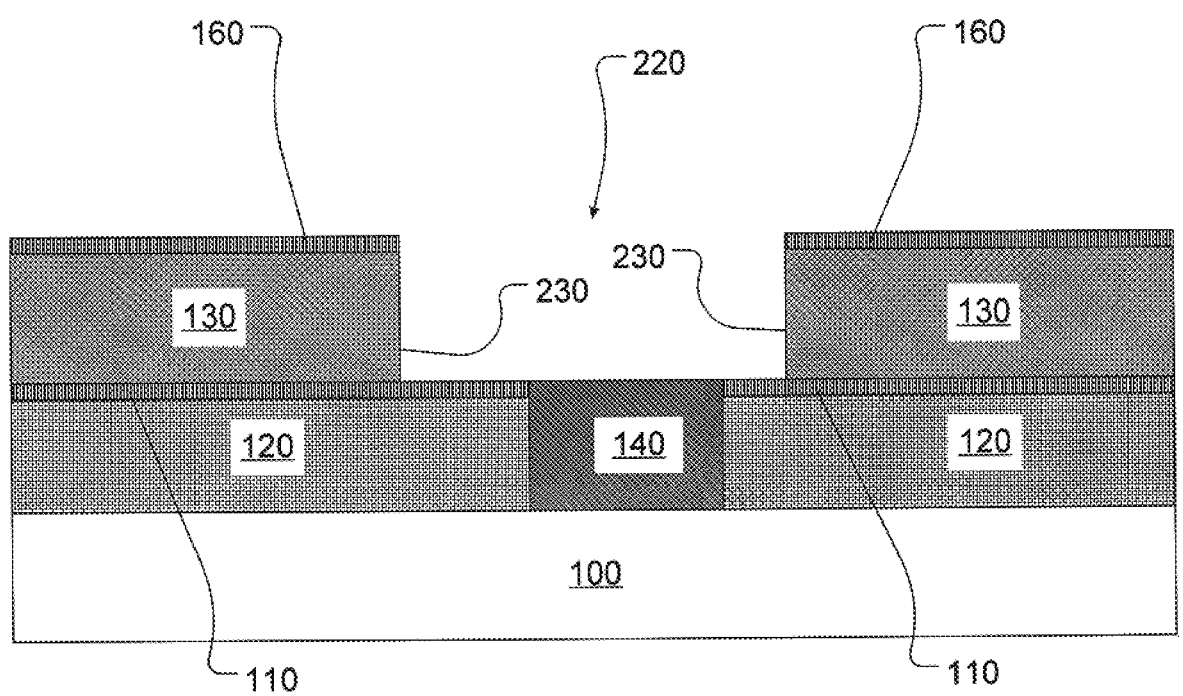

As shown in FIG. 3, the patterned photomask 150 (FIGS. 1–2) is stripped off, by ashing, for example. Alternatively, the patterned photomask 150 may be stripped using a 1:1 solution of sulfuric acid ($H_2SO_4$) to hydrogen peroxide ($H_2O_2$), for example.

Figure 4:
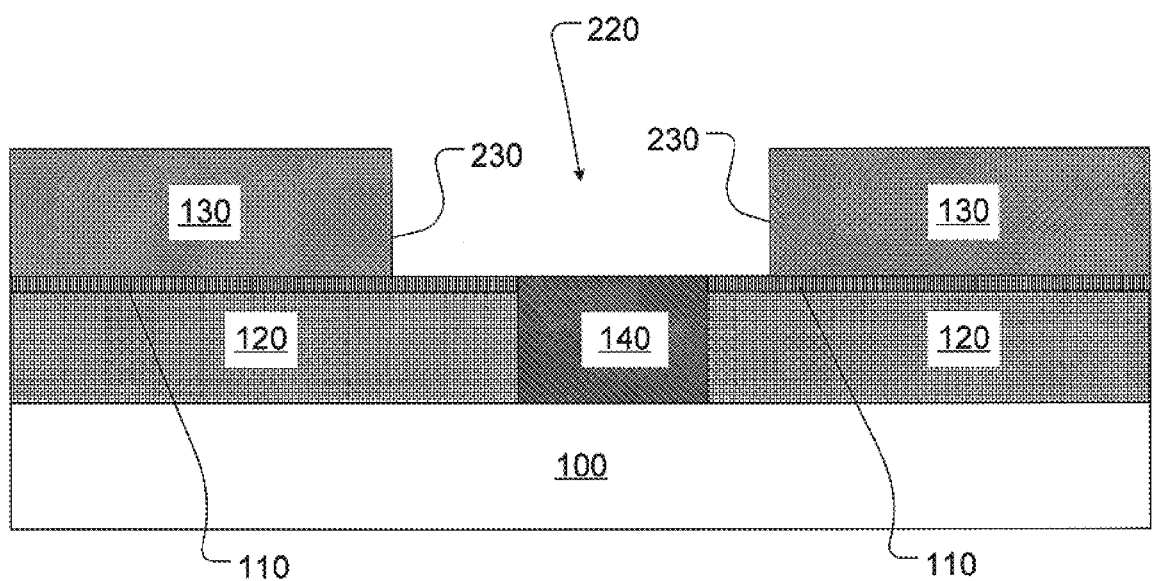

As shown in FIG. 4, the etch stop layer 160 is then stripped off, by selective etching, for example. In various illustrative embodiments, for example, in which the etch stop layer 160 comprises silicon nitride ($Si_3N_4$), hot aqueous phosphoric acid ($H_3PO_4$) may be used to selectively etch the silicon nitride ($Si_3N_4$) etch stop layer 160.

Figure 5:
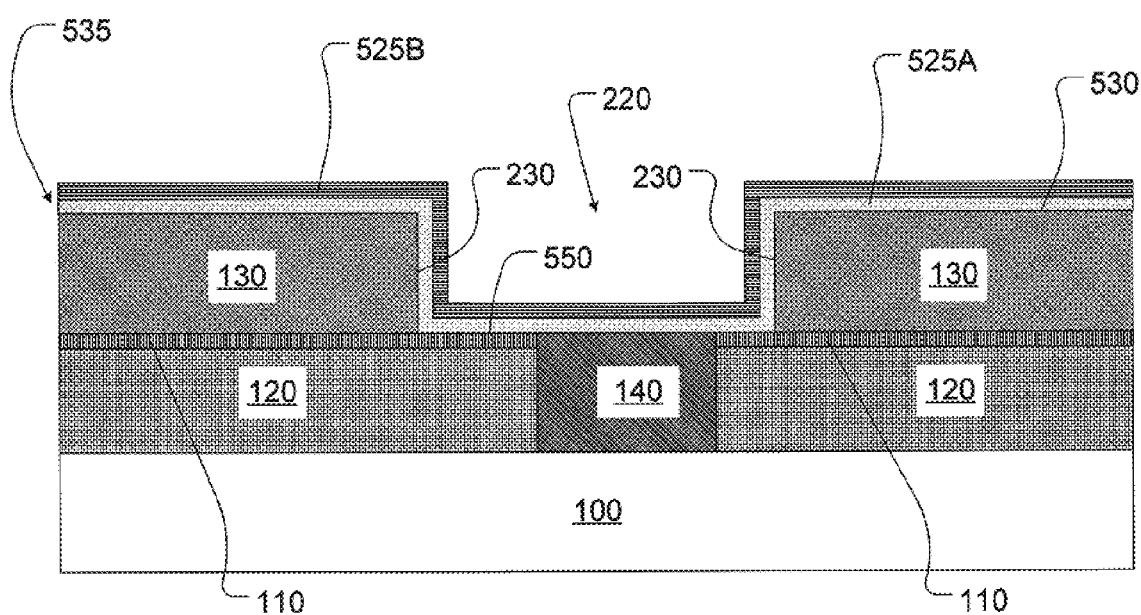

As shown in FIG. 5, a thin barrier metal layer 525A and a copper seed layer 525B (or a seed layer of another conductive material) are applied to the entire surface using vapor-phase deposition. The barrier metal layer 525A and the copper (Cu) seed layer 525B blanket-deposit an entire upper surface 530 of the second dielectric layer 130 as well as the side surfaces 230 and a bottom surface 550 of the opening 220, forming a conductive surface 535, as shown in FIG. 5.

The barrier metal layer 525A may be formed of at least one layer of a barrier metal material, such as tantalum (Ta) or tantalum nitride (TaN), and the like, or, alternatively, the barrier metal layer 525A may be formed of multiple layers of such barrier metal materials. For example, the barrier metal layer 525A may also be formed of titanium nitride (TiN), titanium-tungsten, nitrided titanium-tungsten, magnesium, a sandwich barrier metal Ta/TaN/Ta material, or another suitable barrier material. Tantalum nitride (TaN) is believed to be a good diffusion barrier to copper (Cu). Tantalum (Ta) is believed to be easier to deposit than tantalum nitride (TaN), while tantalum nitride (TaN) is easier to subject to a chemical mechanical polishing (CMP) process than tantalum (Ta). The copper seed layer 525B may be formed on top of the one or more barrier metal layers 525A by physical vapor deposition (PVD) or chemical vapor deposition (CVD), for example.

The bulk of the copper trench-fill (or trench-fill of another conductive material) is frequently done using an electroplating technique, where the conductive surface 535 is mechanically clamped to an electrode (not shown) to establish an electrical contact, and the structure layer 100 and overlying layers are then immersed in an electrolyte solution containing copper (Cu) ions (or ions of another conductive material). An electrical current is then passed through the workpiece-electrolyte system to cause reduction and deposition of copper (Cu) (or ions of another conductive material) on the conductive surface 535. In addition, an alternating-current bias of the workpiece-electrolyte system has been considered as a method of self-planarizing the deposited copper (Cu) film (or film of another conductive material), similar to the deposit-etch cycling used in high-density plasma (HDP) tetraethyl orthosilicate (TEOS) dielectric depositions.

Figure 6:
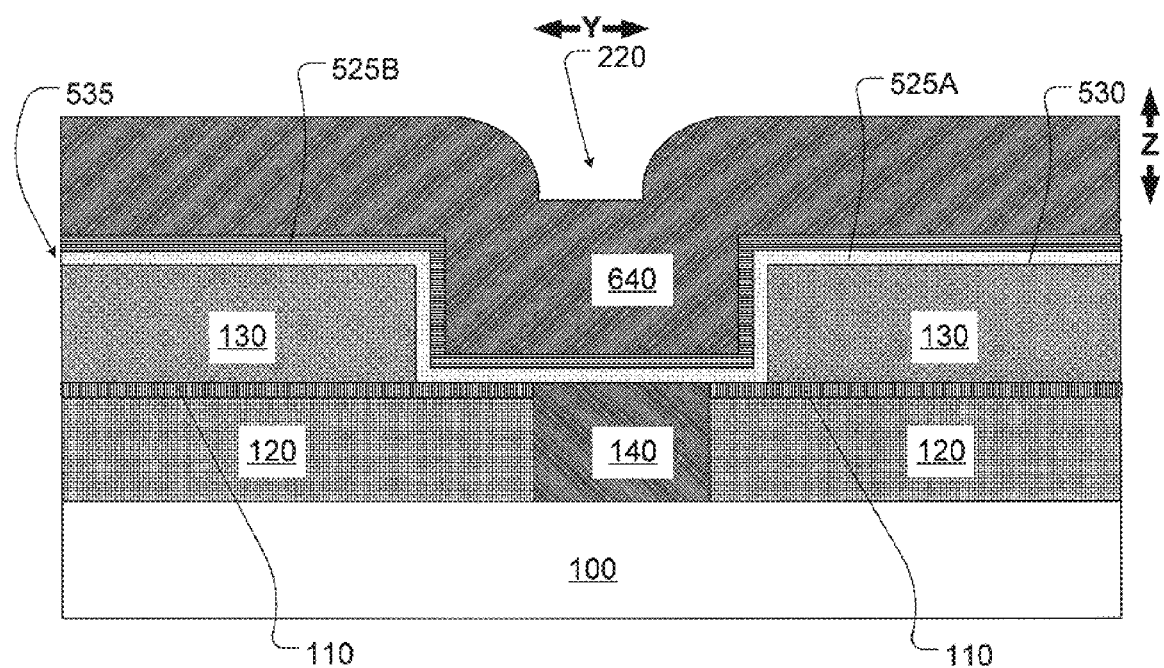

As shown in FIG. 6, this process typically produces a conformal coating of a copper (Cu) layer 640 (or another conductive material) of substantially constant thickness across the entire conductive surface 535. The copper (Cu) layer 640 may then be annealed using a rapid thermal anneal (RTA) process performed at a temperature ranging from approximately 100–400° C. for a time ranging from approximately 10–180 seconds. Alternatively, the copper (Cu) layer 640 may be annealed using a furnace anneal process at a temperature ranging from approximately 100–400° C. for a time ranging from approximately 10–90 minutes. In various alternative embodiments, the copper (Cu) layer 640 may be annealed using a rapid thermal anneal (RTA) process performed at a temperature ranging from approximately 250–350° C. for a time ranging from approximately 10–80 seconds. In still other various illustrative embodiments, the copper (Cu) layer 640 may be annealed using a furnace anneal process at a temperature ranging from approximately 250–350° C. for a time ranging from approximately 10–90 minutes.

A post-formation anneal may be used to accelerate room-temperature grain growth in the copper (Cu) layer 640, and, consequently, may affect the mechanical stress state of the copper (Cu) layer 640. In particular, the post-formation anneal of over-filled damascene openings, such as opening 220 shown in FIG. 6, affects the mechanical stress state of the copper (Cu) layer 640. For anneals performed at temperatures ranging from about 150–400° C., the copper (Cu) layer 640 is in a relatively low mechanical stress state that is effectively mechanical stress-free, or slightly compressive, since the copper (Cu) has no native oxide strengthening mechanism and since the copper (Cu) grain size is small. The copper (Cu) grain growth in the small-grained copper (Cu) layer 640 under compression will act to relax the mechanical stress. In the copper (Cu) in the opening 220 covered by the sufficiently thick layer of the copper (Cu) layer 640, it is likely that the mechanical stress in the copper (Cu) would be about zero or at least very small at the anneal temperatures ranging from about 150–400° C. The microstructure of the copper (Cu) in the opening 220 is influenced by the sufficiently thick layer of the copper (Cu) layer 640, and it is believed that the mechanical stress in the copper (Cu) in the opening 220 is also influenced by the sufficiently thick layer of the copper (Cu) layer 640.

Upon cooling from the anneal, the mechanical stress in the copper (Cu) in the opening 220 is tensile. Since the copper (Cu) of the copper (Cu) layer 640 has a thickness, measured from the bottom of the opening 220, in a range of approximately 3000 Å–8000 Å, for example, the mechanical stress in the copper (Cu) in the opening 220 is relatively small, with hydrostatic stresses in a range of from about 50 MPa to about 200 MPa.

The mechanical stress in the copper (Cu) in the opening 220 is tensile, after cooling down from the anneal, due in part to the difference in the coefficient of thermal expansion ($\Delta$CTE) between the copper (Cu) in the copper (Cu) layer 640 and the semiconducting material of the structure layer 100. For example, the coefficient of thermal expansion (CTE) for silicon (Si) is about $2.6 \times 10^{-6}$/° C., the coefficient of thermal expansion (CTE) for copper (Cu) is about $16.6 \times 10^{-6}$/° C., and the coefficient of thermal expansion (CTE) for aluminum (Al) is about $23.1 \times 10^{-6}$/° C. Therefore, the difference in the coefficient of thermal expansion ($\Delta$CTE) between copper (Cu) and silicon (Si) is about $14.0 \times 10^{-6}$/° C. For the sake of comparison, the difference in the coefficient of thermal expansion ($\Delta$CTE) between aluminum (Al) and silicon (Si) is about $20.5 \times 10^{-6}$/° C., or about 1.46 times larger than the difference in the coefficient of thermal expansion ($\Delta$CTE) between copper (Cu) and silicon (Si). The difference in the coefficient of thermal expansion ($\Delta$CTE) is the dominant source of mechanical strain in a metallic interconnect.

The mechanical stress may be calculated from the mechanical strain using mechanical stiffness coefficients. An order of magnitude estimate of the mechanical stress may be calculated using the biaxial modulus. The biaxial modulus of silicon (Si) is about $1.805 \times 10^5$ MPa (MegaPascals), the biaxial modulus of copper (Cu) is about $2.262 \times 10^5$ MPa, and the biaxial modulus of aluminum (Al) is about $1.143 \times 10^5$ MPa, or about half the biaxial modulus of copper (Cu).

In one illustrative embodiment, copper (Cu) lines having critical dimensions of about 0.25 $\mu$m, and a thickness of approximately 4500 Å, similar to the copper (Cu) layer 640, are subjected to a post-plating anneal using a furnace anneal process performed at a temperature of approximately 250° C. for a time of approximately 30 minutes. The mechanical stresses measured along the lengths (X direction, into the page of FIG. 6) of these copper (Cu) lines are about 300 MPa, the mechanical stresses measured along the widths (Y direction, horizontal arrows in FIG. 6) of these copper (Cu) lines are about 160 MPa, and the mechanical stresses measured along the heights (Z direction, horizontal arrows in FIG. 6) of these copper (Cu) lines are about 55 MPa. The hydrostatic mechanical stress measured with these copper (Cu) lines is about 175 MPa.

These mechanical stress levels appear to be a function of the post-plating anneal temperature. By way of comparison, copper (Cu) lines having critical dimensions of about 0.25 $\mu$m, and a thickness of approximately 4500 Å, similar to the copper (Cu) layer 640, subjected to a post-plating anneal using a furnace anneal process performed at a higher temperature of approximately 500° C. for the same time of approximately 30 minutes have been measured to have the following mechanical stresses. The mechanical stresses measured along the lengths (X direction) of these copper (Cu) lines are about 600 MPa, the mechanical stresses measured along the widths (Y direction) of these copper (Cu) lines are about 470 MPa, and the mechanical stresses measured along the heights (Z direction) of these copper (Cu) lines are about 230 MPa. The hydrostatic mechanical stress measured with these copper (Cu) lines is about 440 MPa. Since hydrostatic mechanical stress is the driving force for void formation in metallic interconnects, efforts should be made to reduce this hydrostatic mechanical stress. Thus, the post-plating anneal temperature should be lowered to reduce this hydrostatic mechanical stress. For example, a post-plating furnace anneal process performed at approximately 250° C. for approximately 30 minutes, which produces a hydrostatic mechanical stress of about 175 MPa, is preferable to a post-plating furnace anneal process performed at approximately 500° C. for approximately 30 minutes, which produces a hydrostatic mechanical stress of about 440 MPa.

Illustrative mechanical stress measurements for both aluminum (Al) and copper (Cu) lines and interconnects, under a variety of conditions, are described, for example, in "Mechanical stresses in aluminum and copper interconnect lines for 0.18 $\mu$m logic technologies," by Paul R. Besser et al., in Materials Research Society Symposium Proceedings Vol. 563, Proceedings of the Materials Reliability in Microelectronics IX Symposium, San Francisco, Apr. 6, 1999, hereby incorporated in its entirety by reference herein, as if set forth below.

Figure 7:
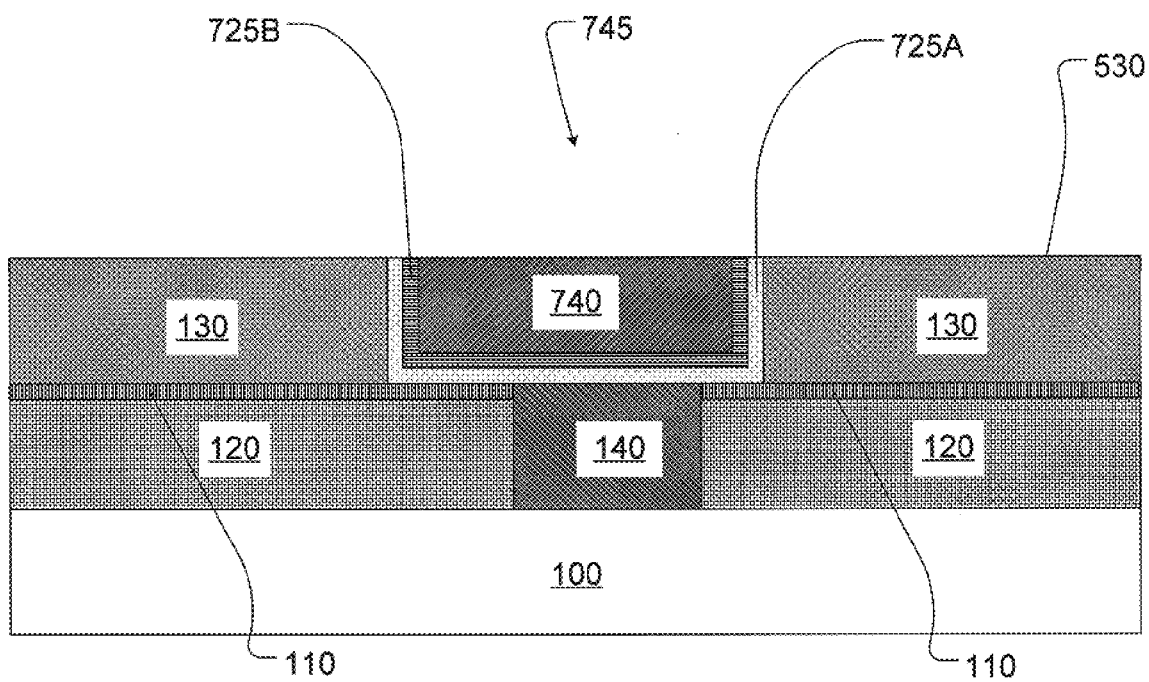

As shown in FIG. 7, following the post-deposition anneal described above, the layer of the copper (Cu) layer 640 is planarized using chemical mechanical polishing (CMP) techniques. The planarization using CMP clears all copper (Cu) and barrier metal from the entire upper surface 530 of the second dielectric layer 130, leaving a copper (Cu) portion 740 of the copper (Cu) layer 640 remaining in a metal structure such as a copper (Cu)-filled trench, forming a copper (Cu)-interconnect 745, adjacent remaining portions 725A and 725B of the one or more barrier metal layers 525A and copper seed layer 525B (FIGS. 5 and 6), respectively, as shown in FIG. 7.

As shown in FIG. 7, the copper (Cu)-interconnect 745 may be formed by annealing the copper (Cu) portion 740, adjacent the remaining portions 725A and 725B of the one or more barrier metal layers 525A and copper seed layer 525B (FIGS. 5 and 6), to the first conductive structure 140. The anneal process may be performed in a traditional tube furnace, at a temperature ranging from approximately 100–500° C., for a time period ranging from approximately 10–90 minutes, in a nitrogen-containing ambient that may include at least one of ammonia ($NH_3$), molecular nitrogen ($N_2$), molecular hydrogen ($H_2$), argon (Ar), and the like. Alternatively, the anneal process may be a rapid thermal anneal (RTA) process performed at a temperature ranging from approximately 100–500° C. for a time ranging from approximately 10–180 seconds in a nitrogen-containing ambient that may include at least one of molecular nitrogen ($N_2$), molecular hydrogen ($H_2$), argon (Ar), and the like.

Figure 8:
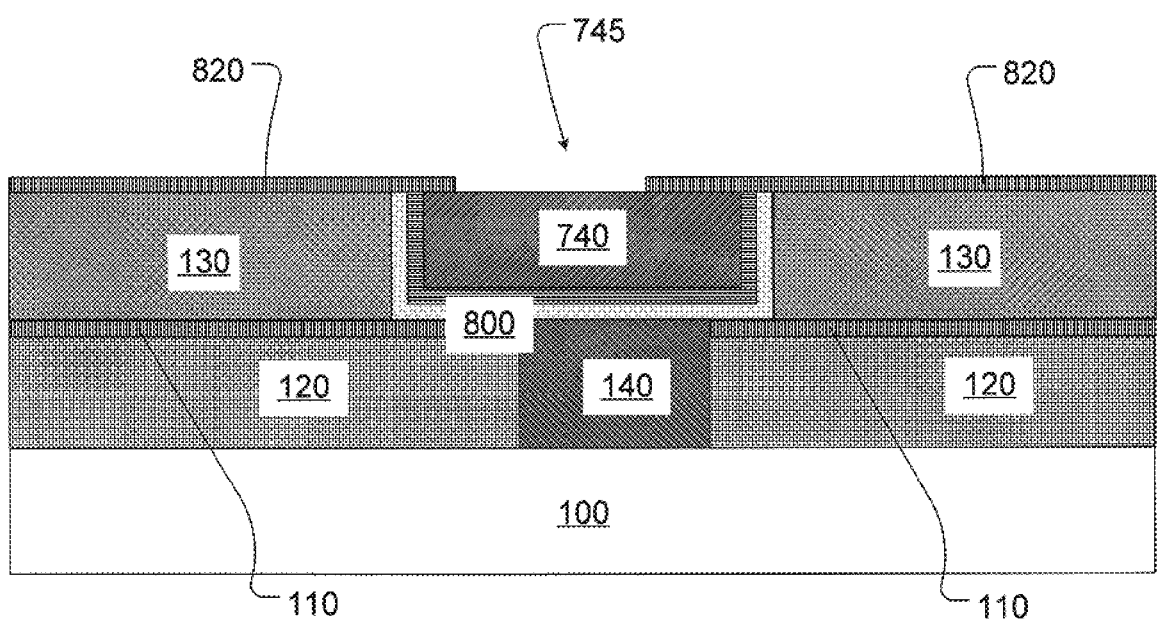

As shown in FIG. 8, the second dielectric layer 130 may be planarized, as needed, using chemical mechanical polishing (CMP) techniques. Planarization would leave the planarized second dielectric layer 130 adjacent the copper (Cu)-interconnect 745 and above the etch stop layer 110, forming a copper (Cu)-interconnect layer 800. The copper (Cu)-interconnect layer 800 may include the copper (Cu)-interconnect 745 adjacent the second dielectric layer 130. The copper (Cu)-interconnect layer 800 may also include the etch stop layer 110. As shown in FIG. 8, the copper (Cu)-interconnect layer 800 may also include an etch stop layer 820 (also known as a "hard mask" and typically formed of silicon nitride, $Si_3N_4$, or SiN, for short) formed and patterned above the second dielectric layer 130 and above at least a portion of the copper (Cu)-interconnect 745.

Figure 9:
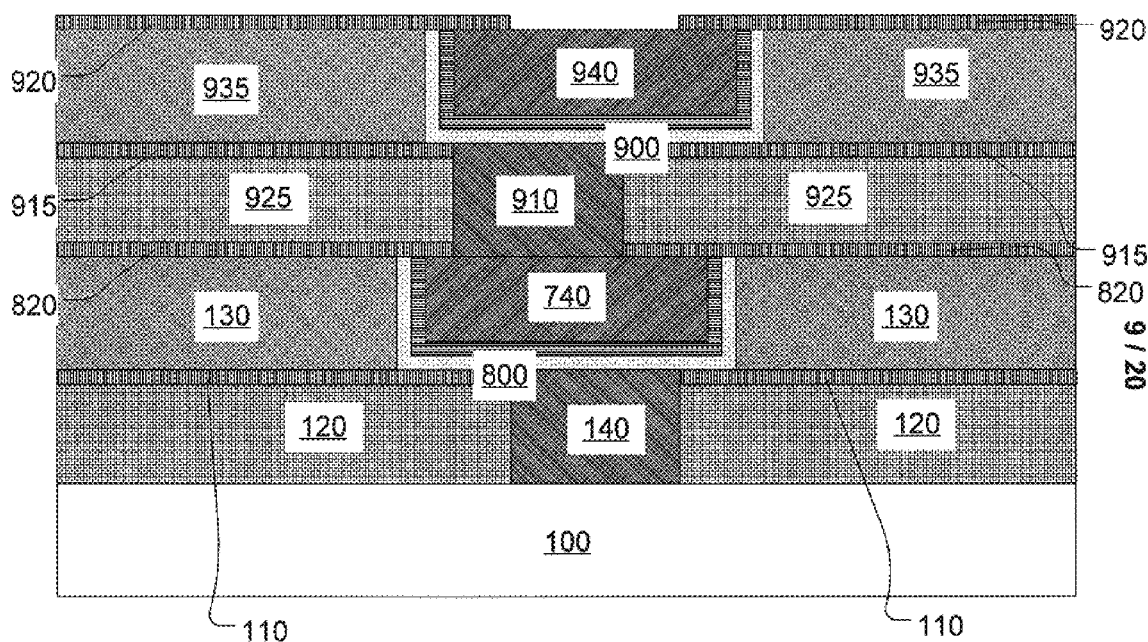
FIG. 9 schematically illustrates multiple layers of copper interconnects according to various embodiments of the present invention.

As shown in FIG. 9, the copper (Cu)-interconnect layer 800 may be an underlying structure layer (similar to the structure layer 100) to a copper (Cu)-interconnect layer 900. The copper (Cu)-interconnect layer 900 may include a copper (Cu)-filled trench 940 and an intermetal via connection 910 adjacent a planarized dielectric layer 935. The intermetal via connection 910 may be a copper (Cu) structure similar to the first copper (Cu) structure 140, and the intermetal via connection 910 may be annealed to the copper (Cu)-filled trench 940 in a similar fashion to the anneal described above in relation to the formation of the copper (Cu)-interconnect 745 (FIG. 7). The copper (Cu)-interconnect layer 900 may also include the etch stop layer 820 and/or etch stop layer 915 and/or etch stop layer 920 (also known as "hard masks" and typically formed of silicon nitride, $Si_3N_4$, or SiN, for short) formed and patterned above the planarized dielectric layers 925 and/or 935, respectively. The etch stop layer 920 may also be formed above at least a portion of the copper (Cu)-filled trench 940.

Figure 10:
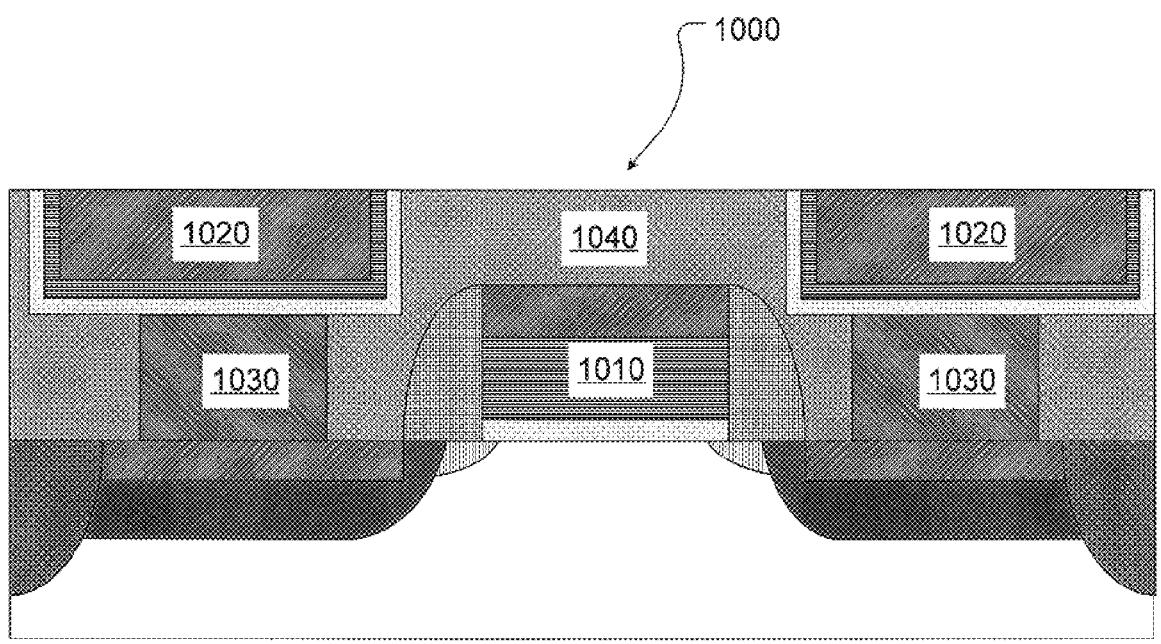
FIG. 10 schematically illustrates copper interconnects according to various embodiments of the present invention connecting source/drain regions of an MOS transistor.

As shown in FIG. 10, an MOS transistor 1010 may be an underlying structure layer (similar to the structure layer 100) to a copper (Cu)-interconnect layer 1000. The copper (Cu)-interconnect layer 1000 may include copper (Cu)-filled trenches 1020 and copper intermetal via connections 1030 adjacent a planarized dielectric layer 1040. The copper intermetal via connections 1030 may be copper (Cu) structures similar to the first copper (Cu) structure 140, and the copper intermetal via connections 1030 may be annealed to the second copper (Cu) structures 1020 in a similar fashion to the anneal described above in relation to the formation of the copper (Cu)-interconnect 745 (FIG. 7).

Figure 11:
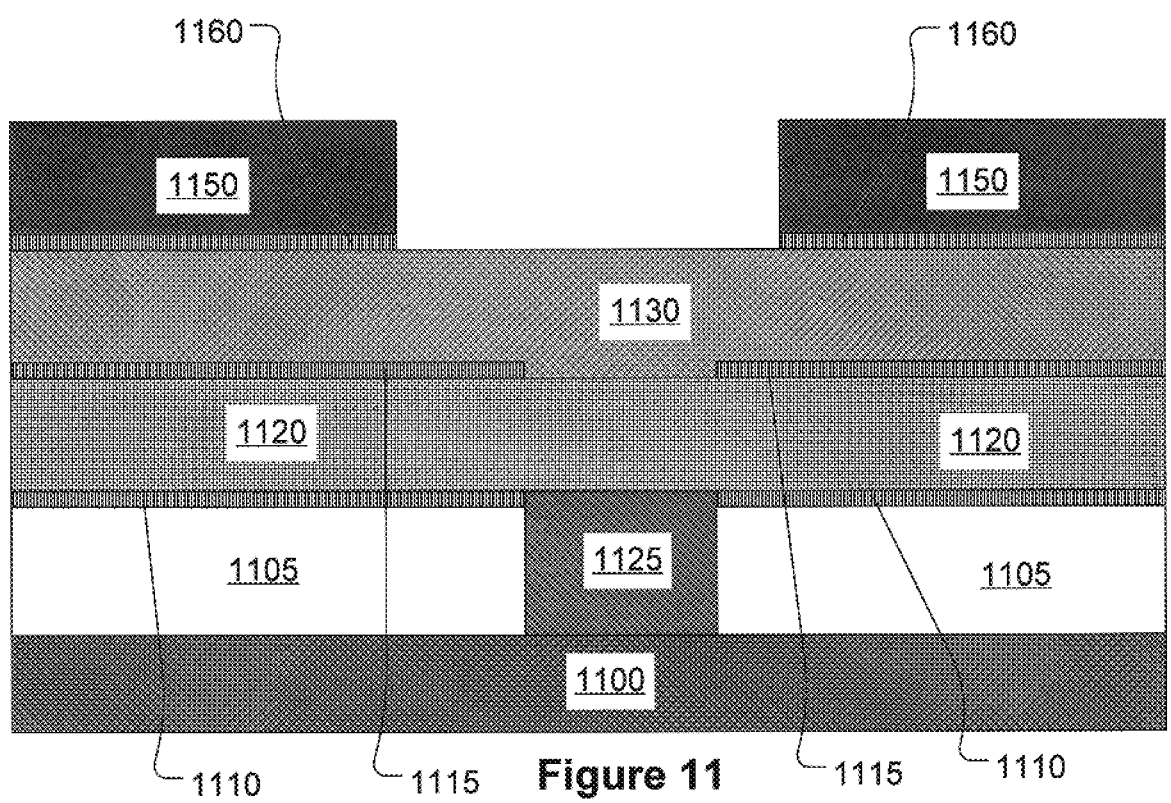
FIGS. 11–18 schematically illustrate a dual-damascene copper interconnect process flow according to various embodiments of the present invention.

As shown in FIG. 11, a first dielectric layer 1105 and a first conductive structure 1125 (such as a copper intermetal via connection) may be formed above a structure 1100 such as a semiconducting substrate. However, the present invention is not limited to the formation of a copper (Cu)-based interconnect above the surface of a semiconducting substrate such as a silicon wafer, for example. Rather, as will be apparent to one skilled in the art upon a complete reading of the present disclosure, a copper (Cu)-based interconnect formed in accordance with the present invention may be formed above previously formed semiconductor devices and/or process layer, e.g., transistors, or other similar structure. In effect, the present invention may be used to form process layers on top of previously formed process layers. The structure 1100 may be an underlayer of semiconducting material, such as a silicon substrate or wafer, or, alternatively, may be an underlayer of semiconductor devices (see FIG. 20, for example), such as a layer of metal oxide semiconductor field effect transistors (MOSFETs), and the like, and/or a metal interconnection layer or layers (see FIG. 19, for example) and/or an interlevel (or interlayer) dielectric (ILD) layer or layers, and the like.

In a dual-damascene copper process flow, according to various embodiments of the present invention, as shown in FIGS. 11–18, a second dielectric layer 1120 is formed above the first dielectric layer 1105 and above the first conductive structure 1125. A third dielectric layer 1130 is formed above the second dielectric layer 1120. A patterned photomask 1150 is formed above the third dielectric layer 1130. The first dielectric layer 1105 has an etch stop layer (ESL) 1110 (also known as a "hard mask" and typically formed of silicon nitride, $Si_3N_4$, or SiN, for short) formed and patterned thereon, between the first dielectric layer 1105 and the second dielectric layer 1120. Similarly, the second dielectric layer 1120 has an etch stop layer 1115 (also typically formed of SiN) formed and patterned thereon, between the second dielectric layer 1120 and the third dielectric layer 1130.

As will be described in more detail below in conjunction with FIG. 12, the first etch stop layer 1110 and a second etch stop layer 1115 define a lower (via) portion of the copper interconnect formed in the dual-damascene copper process flow. If necessary, the third dielectric layer 1130 may be planarized using chemical-mechanical planarization (CMP). The third dielectric layer 1130 has an etch stop layer 1160 (typically also SiN) formed and patterned thereon, between the third dielectric layer 1130 and the patterned photomask 1150.

The first, second and third dielectric layers 1105, 1120 and 1130 may be formed from a variety of "low dielectric constant" or "low K" (K is less than or equal to about 4) dielectric materials. The first, second and third dielectric layers 1105, 1120 and 1130 may be formed by a variety of known techniques for forming such layers, e.g., chemical vapor deposition (CVD), low-pressure CVD (LPCVD), plasma-enhanced CVD (PECVD), sputtering, physical vapor deposition (PVD), spin-on glass, and the like, and may each have a thickness ranging from approximately 3000 Å–8000 Å, for example.

The first, second and third dielectric layers 1105, 1120 and 1130 may be formed from a variety of low K dielectric materials, where K is less than or equal to about 4. Examples include Applied Material's Black Diamond®, Novellus' Coral®, Allied Signal's Nanoglass®, JSR's LKD5104, and the like. In one illustrative embodiment, the first, second and third dielectric layers 1105, 1120 and 1130 are each comprised of Applied Material's Black Diamond®, each having a thickness of approximately 5000 Å, each being formed by being blanket-deposited by an LPCVD process for higher throughput.

Figure 12:
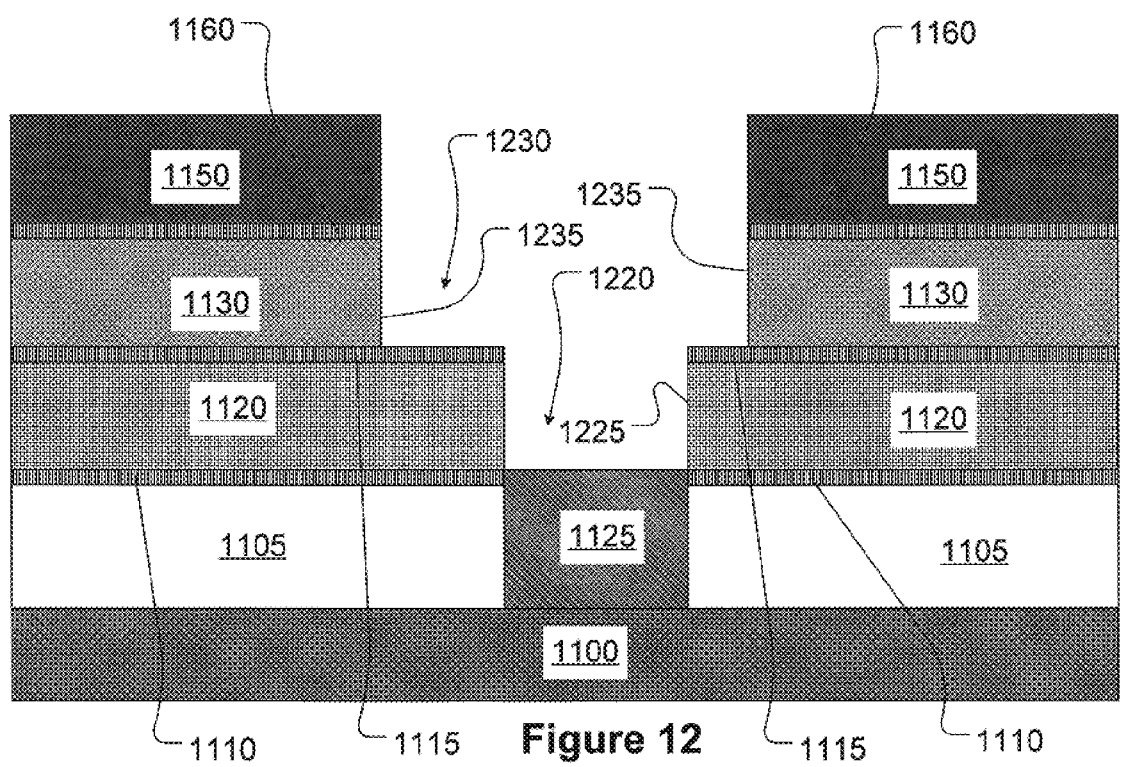

As shown in FIG. 12, a metallization pattern is then formed by using the patterned photomask 1150, the etch stop layer's 1160, 1115 and 1110 (FIGS. 11–12), and photolithography. For example, first and second openings, such as via 1220 and trench 1230, for conductive metal lines, contact holes, via holes, and the like, are etched into the second and third dielectric layers 1120 and 1130, respectively (FIG. 12). The first and second openings 1220 and 1230 have sidewalls 1225 and 1235, respectively. The first and second openings 1220 and 1230 may be formed by using a variety of known anisotropic etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used in various illustrative embodiments. The etching may stop at the etch stop layer 1110 and at the first conductive structure 1125.

Figure 13:
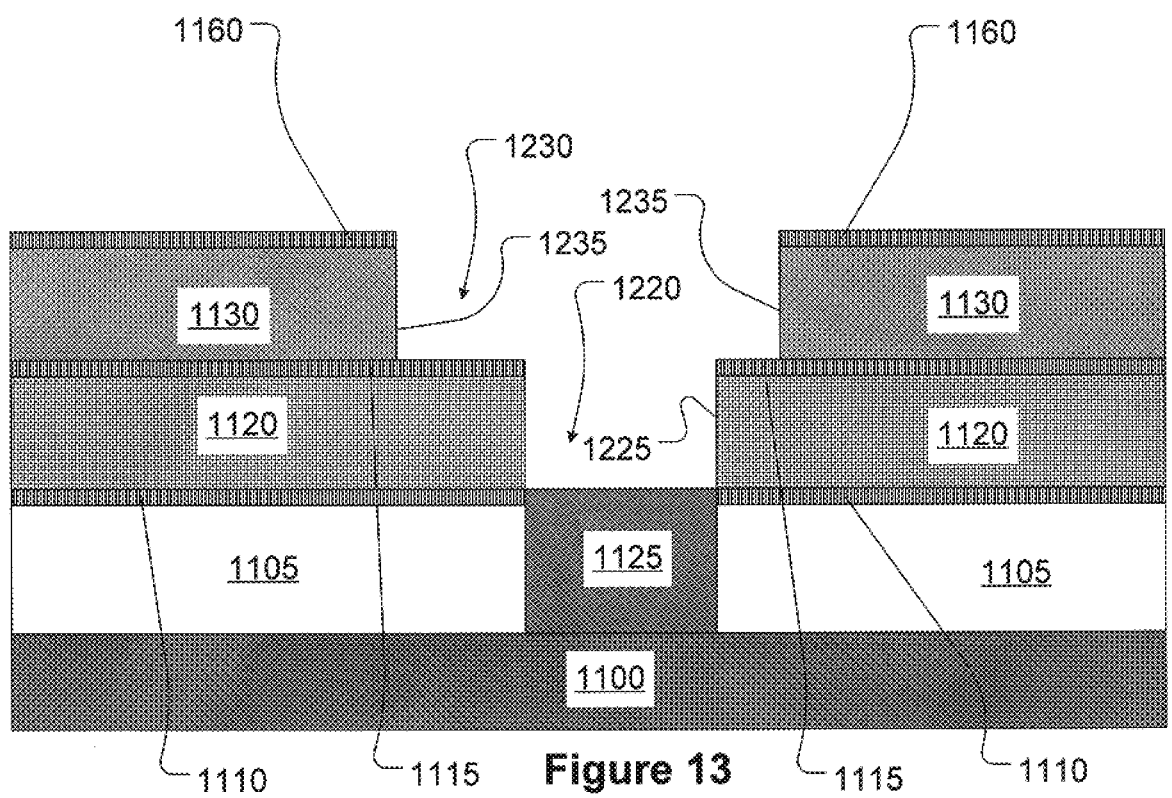

As shown in FIG. 13, the patterned photomask 1150 (FIGS. 11–12) is stripped off, by ashing, for example. Alternatively, the patterned photomask 1150 may be stripped using a 1:1 solution of sulfuric acid ($H_2SO_4$) to hydrogen peroxide ($H_2O_2$), for example.

Figure 14:
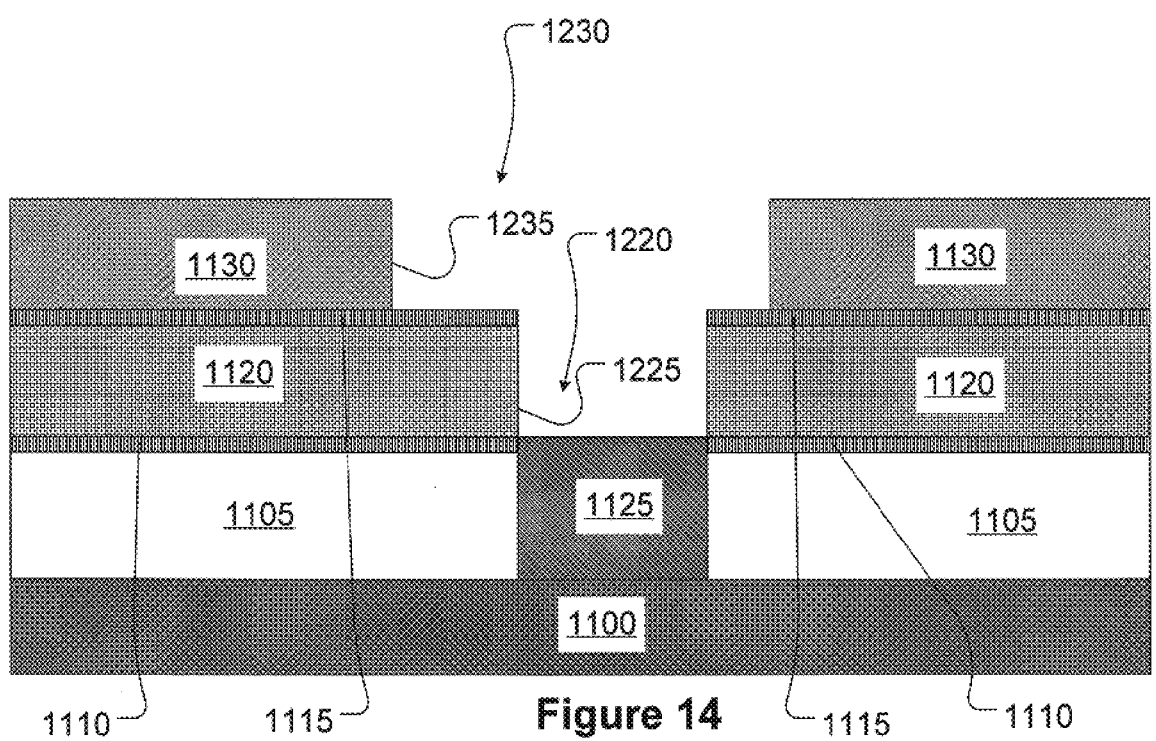

As shown in FIG. 14, the etch stop layer 1160 is then stripped off, by selective etching, for example. In various illustrative embodiments, for example, in which the etch stop layer 1160 comprises silicon nitride ($Si_3N_4$), hot aqueous phosphoric acid ($H_3PO_4$) may be used to selectively etch the silicon nitride ($Si_3N_4$) etch stop layer 1160.

Figure 15:
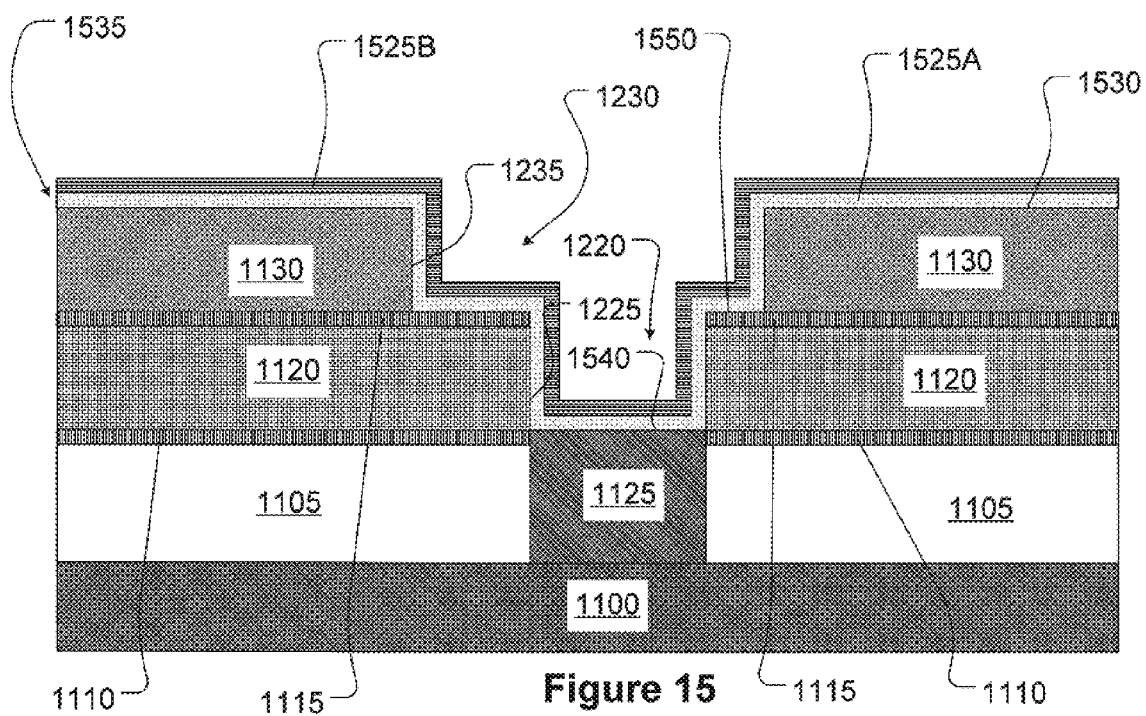

As shown in FIG. 15, a thin barrier metal layer 1525A and a copper seed layer 1525B (or a seed layer of another conductive material) are applied to the entire surface using vapor-phase deposition. The barrier metal layer 1525A and the copper (Cu) seed layer 1525B blanket-deposit the entire upper surface 1530 of the third dielectric layer 1130 as well as the respective side surfaces 1225 and 1235, and respective bottom areas 1540 and 1550, of the first and second openings 1220 and 1230, respectively, forming a conductive surface 1535, as shown in FIG. 15.

The barrier metal layer 1525A may be formed of at least one layer of a barrier metal material, such as tantalum (Ta) or tantalum nitride (TaN), and the like. For example, the barrier metal layer 1525A may also be formed of titanium nitride (TiN), titanium-tungsten, nitrided titanium-tungsten, magnesium, a sandwich barrier metal Ta/TaN/Ta material, or another suitable barrier material. Tantalum nitride (TaN) is believed to be a good diffusion barrier to copper (Cu). Tantalum (Ta) is believed to be easier to deposit than tantalum nitride (TaN), while tantalum nitride (TaN) is easier to subject to a chemical mechanical polishing (CMP) process than tantalum (Ta). The copper seed layer 1525B may be formed on top of the one or more barrier metal layers 1525A by physical vapor deposition (PVD) or chemical vapor deposition (CVD), for example.

The bulk of the copper trench-fill (or trench-fill of another conductive material) is frequently done using an electroplating technique, where the conductive surface 1535 is mechanically clamped to an electrode (not shown) to establish an electrical contact, and the structure 1100 and overlying layers are then immersed in an electrolyte solution containing copper (Cu) ions (or ions of another conductive material). An electrical current is then passed through the workpiece-electrolyte system to cause reduction and deposition of copper (Cu) (or ions of another conductive material) on the conductive surface 1535. In addition, an alternating-current bias of the workpiece-electrolyte system has been considered as a method of self-planarizing the deposited copper (Cu) film (or film of another conductive material), similar to the deposit-etch cycling used in high-density plasma (HDP) tetraethyl orthosilicate (TEOS) dielectric depositions.

Figure 16:
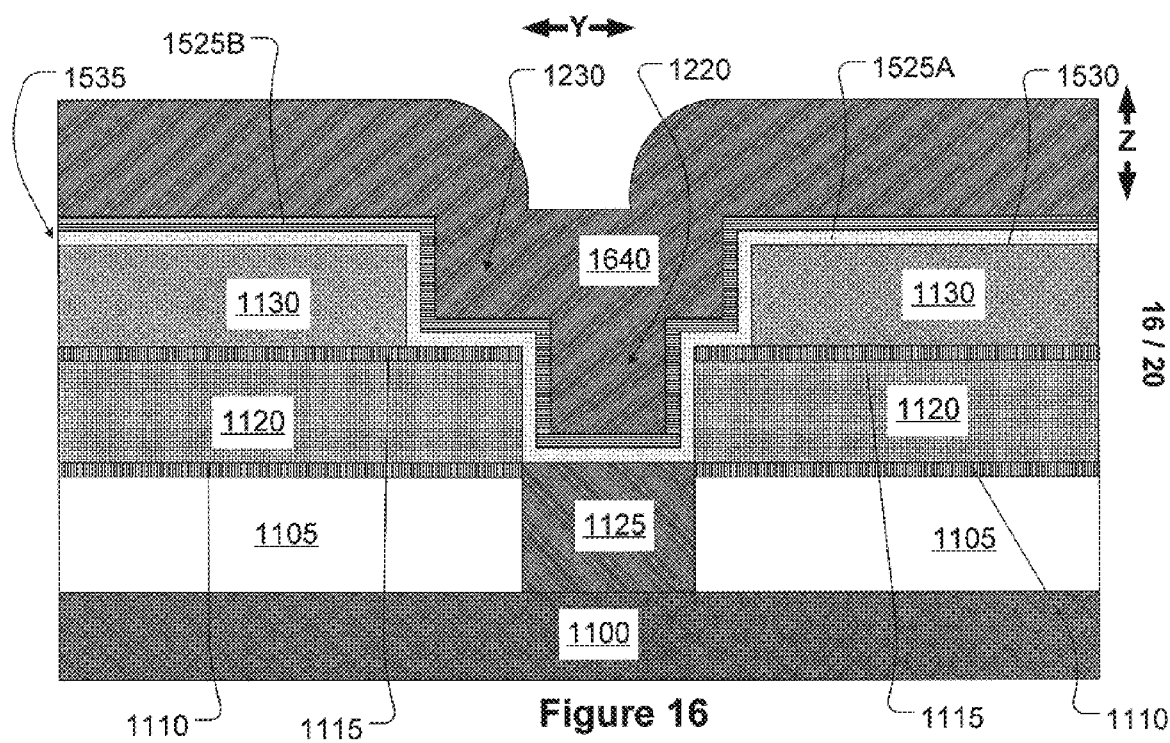

As shown in FIG. 16, this process typically produces a conformal coating of a copper (Cu) layer 1640 (or another conductive material) of substantially constant thickness across the entire conductive surface 1535. The copper (Cu) layer 1640 is then annealed using a rapid thermal anneal (RTA) process performed at a temperature ranging from approximately 100–400° C. for a time ranging from approximately 10–180 seconds. Alternatively, the copper (Cu) layer 1640 may be annealed using a furnace anneal process at a temperature ranging from approximately 100–400° C. for a time ranging from approximately 10–90 minutes. In various alternative embodiments, the copper (Cu) layer 1640 may be annealed using a rapid thermal anneal (RTA) process performed at a temperature ranging from approximately 250–350° C. for a time ranging from approximately 10–180 seconds. In still other various illustrative embodiments, the copper (Cu) layer 1640 may be annealed using a furnace anneal process at a temperature ranging from approximately 250–350° C. for a time ranging from approximately 10–90 minutes.

A post-formation anneal may be used to accelerate room-temperature grain growth in the copper (Cu) layer 1640, and, consequently, may affect the mechanical stress state of the copper (Cu) layer 1640. In particular, the post-formation anneal of over-filled damascene openings, such as openings 1220 and 1230 shown in FIG. 16, affects the mechanical stress state of the copper (Cu) layer 1640. For anneals performed at temperatures ranging from about 150–400° C., the copper (Cu) layer 1640 is in a mechanical stress state that is effectively mechanical stress-free, or slightly compressive, since the copper (Cu) has no native oxide strengthening mechanism and since the copper (Cu) grain size is small. The copper (Cu) grain growth in the small-grained copper (Cu) layer 1640 under compression will act to relax the mechanical stress. In the copper (Cu) in the openings 1220 and 1230 covered by the sufficiently thick layer of the copper (Cu) layer 1640, it is likely that the mechanical stress in the copper (Cu) would be about zero or at least very small at the anneal temperatures ranging from about 150–400° C. The microstructure of the copper (Cu) in the openings 1220 and 1230 is influenced by the sufficiently thick layer of the copper (Cu) layer 1640, and it is believed that the mechanical stress in the copper (Cu) in the openings 1220 and 1230 is also influenced by the sufficiently thick layer of the copper (Cu) layer 1640.

Upon cooling from the anneal, the mechanical stress in the copper (Cu) in the openings 1220 and 1230 is tensile. Since the copper (Cu) of the copper (Cu) layer 1640 has a thickness, measured from the bottom of the opening 1230, in a range of approximately 3000 Å–8000 Å, for example, the mechanical stress in the copper (Cu) in the openings 1220 and 1230 is relatively small, with hydrostatic stresses in a range of from about 50 MPa to about 200 MPa.

The mechanical stress in the copper (Cu) in the openings 1220 and 1230 is tensile, after cooling down from the anneal, due in part to the difference in the coefficient of thermal expansion ($\Delta$CTE) between the copper (Cu) of the copper (Cu) layer 1640 and the semiconducting material of the structure layer 1100. For example, the coefficient of thermal expansion (CTE) for silicon (Si) is about $2.6 \times 10^{-6}/°$ C., the coefficient of thermal expansion (CTE) for copper (Cu) is about $16.6 \times 10^{-6}/°$ C., and the coefficient of thermal expansion (CTE) for aluminum (Al) is about $23.1 \times 10^{-6}/°$ C. Therefore, the difference in the coefficient of thermal expansion ($\Delta$CTE) between copper (Cu) and silicon (Si) is about $14.0 \times 10^{-6}/°$ C. For the sake of comparison, the difference in the coefficient of thermal expansion ($\Delta$CTE) between aluminum (Al) and silicon (Si) is about $20.5\times10^{-6}/°$ C., or about 1.46 times larger than the difference in the coefficient of thermal expansion ($\Delta$CTE) between copper (Cu) and silicon (Si). The difference in the coefficient of thermal expansion ($\Delta$CTE) is the dominant source of mechanical strain in a metallic interconnect.

The mechanical stress may be precisely calculated from the mechanical strain using mechanical stiffness coefficients. An order of magnitude estimate of the mechanical stress may be calculated using the biaxial modulus. The biaxial modulus of silicon (Si) is about $1.805\times10^5$ MPa (MegaPascals), the biaxial modulus of copper (Cu) is about $2.262\times10^5$ MPa, and the biaxial modulus of aluminum (Al) is about $1.143\times10^5$ MPa, or about half the biaxial modulus of copper (Cu).

In one illustrative embodiment, copper (Cu) lines having critical dimensions of about 0.25 $\mu$m, and a thickness of approximately 4500 Å, similar to the copper (Cu) layer 1640, are subjected to a post-plating anneal using a furnace anneal process performed at a temperature of approximately 250° C. for a time of approximately 30 minutes. The mechanical stresses measured along the lengths (X direction) of these copper (Cu) lines are about 300 MPa, the mechanical stresses measured along the widths (Y direction) of these copper (Cu) lines are about 160 MPa, and the mechanical stresses measured along the heights (Z direction) of these copper (Cu) lines are about 55 MPa. The hydrostatic mechanical stress measured with these copper (Cu) lines is about 175 MPa.

These mechanical stress levels appear to be a function of the post-plating anneal temperature. By way of comparison, copper (Cu) lines having critical dimensions of about 0.25 $\mu$m, and a thickness of approximately 4500 Å, similar to the copper (Cu) layer 1640, subjected to a post-plating anneal using a furnace anneal process performed at a higher temperature of approximately 500° C. for the same time of approximately 30 minutes have been measured to have the following mechanical stresses. The mechanical stresses measured along the lengths (X direction) of these copper (Cu) lines are about 600 MPa, the mechanical stresses measured along the widths (Y direction) of these copper (Cu) lines are about 470 MPa, and the mechanical stresses measured along the heights (Z direction) of these copper (Cu) lines are about 230 MPa. The hydrostatic mechanical stress measured with these copper (Cu) lines is about 440 MPa. Since hydrostatic mechanical stress is the driving force for void formation in metallic interconnects, efforts should be made to reduce this hydrostatic mechanical stress. Thus, the post-plating anneal temperature should be lowered to reduce this hydrostatic mechanical stress. For example, a post-plating furnace anneal process performed at approximately 250° C. for approximately 30 minutes, which produces a hydrostatic mechanical stress of about 175 MPa, is preferable to a post-plating furnace anneal process performed at approximately 500° C. for approximately 30 minutes, which produces a hydrostatic mechanical stress of about 440 MPa.

Figure 17:
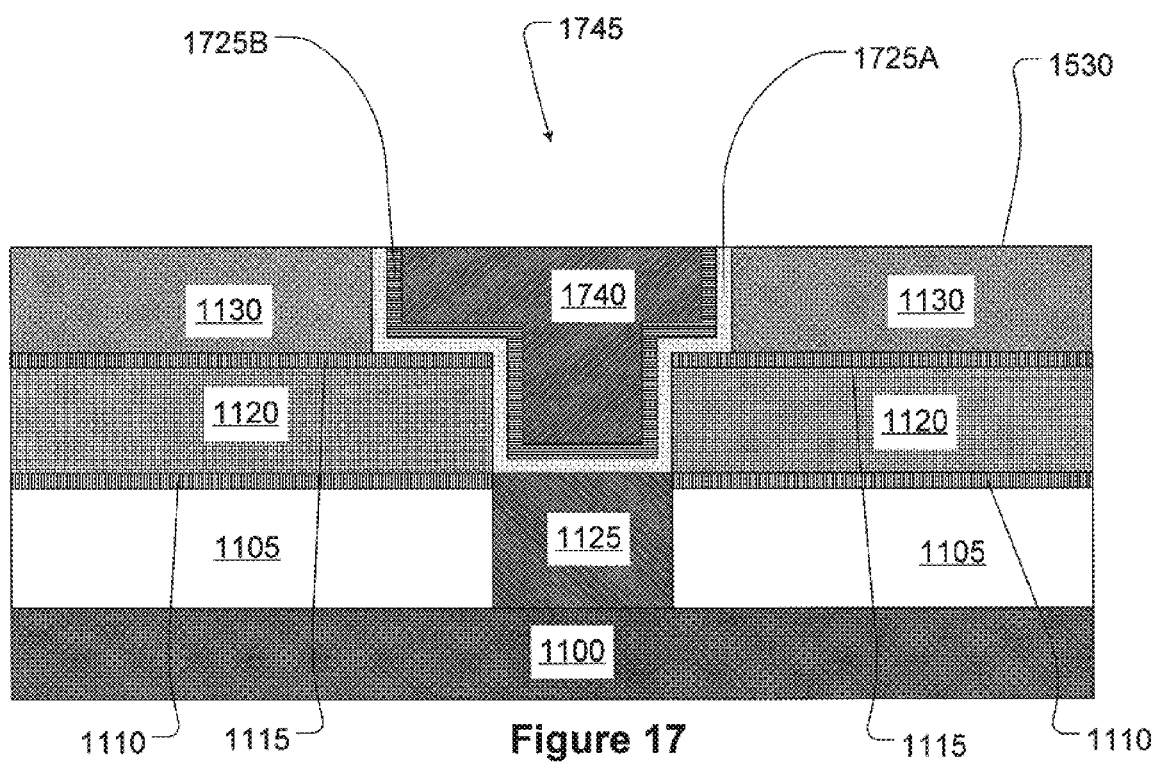

As shown in FIG. 17, once a sufficiently thick layer of the copper (Cu) layer 1640 has been deposited, and following the post-deposition anneal, the layer of the copper (Cu) layer 1640 is planarized using chemical mechanical polishing (CMP) techniques. The planarization using CMP clears all copper (Cu) and barrier metal from the entire upper surface 1530 of the third dielectric layer 1130, leaving a copper (Cu) portion 1740 of the copper (Cu) layer 1640 remaining in a metal structure such as a copper (Cu)-filled trench and via, forming a copper (Cu)-interconnect 1745, adjacent remaining portions 1725A and 1725B of the one or more barrier metal layers 1525A and copper seed layer 1525B (FIGS. 15 and 16), respectively, as shown in FIG. 17.

As shown in FIG. 17, the copper (Cu)-interconnect 1745 may be formed by annealing the copper (Cu) portion 1740, adjacent the remaining portions 1725A and 1725B of the one or more barrier metal layers 1525A and copper seed layer 1525B (FIGS. 15 and 16), to the first conductive structure 1125. The anneal process may be performed in a traditional tube furnace, at a temperature ranging from approximately 100–500° C., for a time period ranging from approximately 10–90 minutes, in a nitrogen-containing ambient that may include at least one of ammonia (NH$_3$), molecular nitrogen (N$_2$), molecular hydrogen (H$_2$), argon (Ar), and the like. Alternatively, the anneal process may be a rapid thermal anneal (RTA) process performed at a temperature ranging from approximately 100–500° C. for a time ranging from approximately 10–180 seconds in a nitrogen-containing ambient that may include at least one of molecular nitrogen (N$_2$), molecular hydrogen (H$_2$), argon (Ar), and the like.

Figure 18:
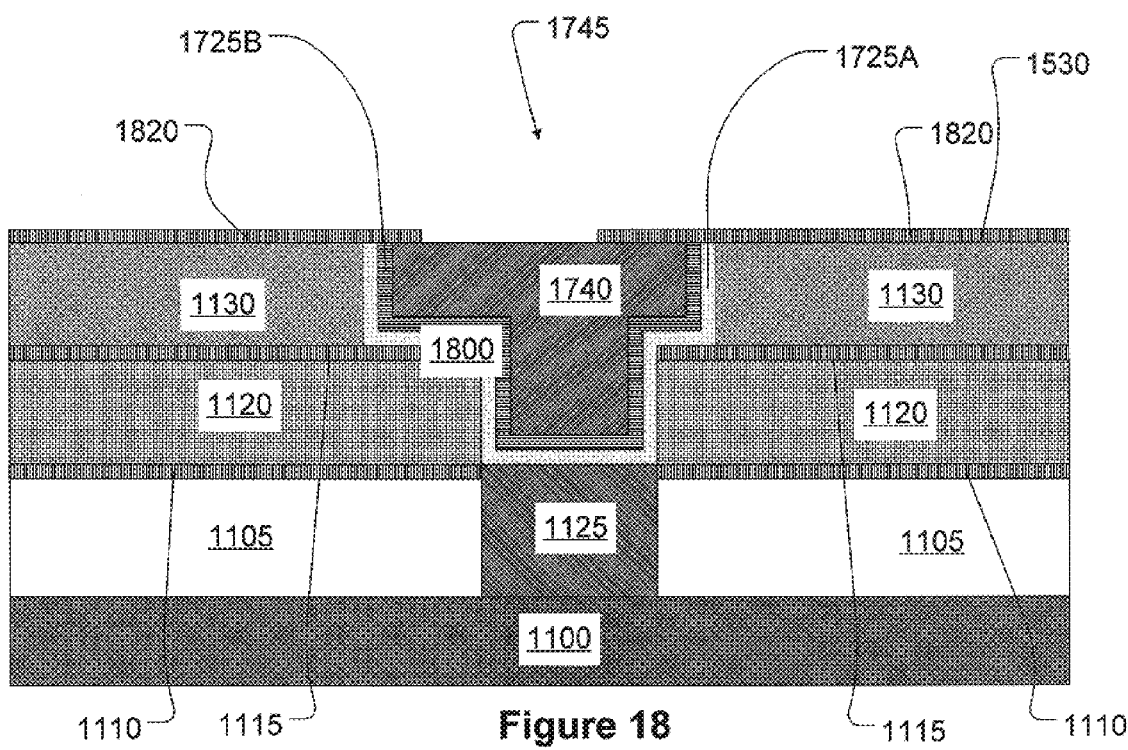

As shown in FIG. 18, the low K third dielectric layer 1130 may be planarized, as needed, using chemical mechanical polishing (CMP) techniques. Planarization would leave the planarized low K third dielectric layer 1130 adjacent the copper (Cu)-interconnect 1745 and above the etch stop layer 1115, forming a portion of a copper (Cu)-interconnect layer 1800. The copper (Cu)-interconnect layer 1800 may include the copper (Cu)-interconnect 1745 adjacent the second and third dielectric layers 1120 and 1130. The copper (Cu)-interconnect layer 1800 may also include the first etch stop layer 1110. As shown in FIG. 18, the copper (Cu)-interconnect layer 1800 may also include an etch stop layer 1820 (also known as a "hard mask" and typically formed of silicon nitride, Si$_3$N$_4$, or SiN, for short) formed and patterned above the third dielectric layer 1130 and above at least a portion of the copper (Cu)-interconnect 1745.

Figure 19:
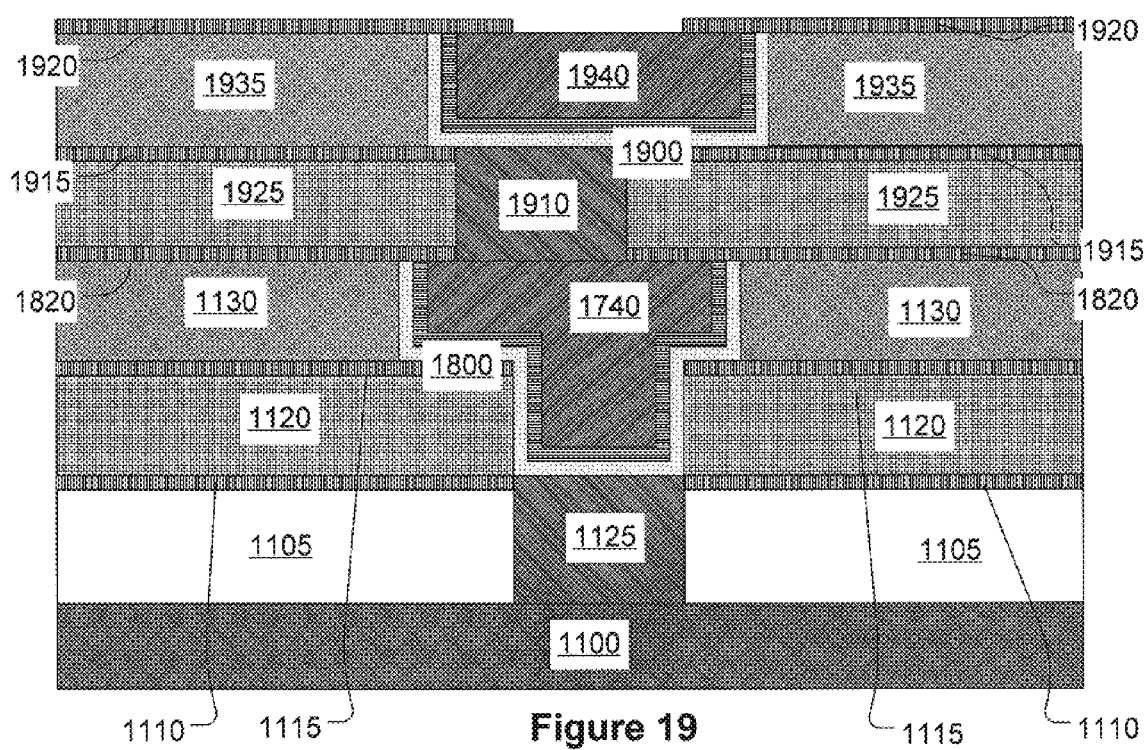
FIG. 19 schematically illustrates multiple layers of copper interconnects according to various embodiments of the present invention.

As shown in FIG. 19, the copper (Cu)-interconnect layer 1800 may be an underlying structure layer (similar to the structure 1100) to a copper (Cu)-interconnect layer 1900. In various illustrative embodiments, the copper (Cu)-interconnect layer 1900 may include a copper (Cu)-filled trench 1940 adjacent a planarized dielectric layer 1935, an intermetal via connection 1910 adjacent a planarized dielectric layer 1925, and an etch stop layer 1915 between the low K dielectric layers 1935 and 1925. The intermetal via connection 1910 may be a copper (Cu) structure similar to the first copper (Cu) structure 1125, and the intermetal via connection 1910 may be annealed to the copper (Cu)-filled trench 1940 in a similar fashion to the anneal described above in relation to the formation of the copper (Cu)-interconnect 745 (FIG. 7). The copper (Cu)-interconnect layer 1900 may also include the etch stop layer 1820 and/or an etch stop layer 1920 formed and patterned above the planarized dielectric layer 1935 and above at least a portion of the copper (Cu)-filled trench 1940.

In various alternative illustrative embodiments, the copper (Cu)-interconnect layer 1900 may be similar to the copper (Cu)-interconnect layer 1800, the copper (Cu)-interconnect layer 1900 having a copper (Cu)-interconnect disposed therein (not shown) that is similar to the copper (Cu)-interconnect 1745 (FIGS. 17–18), for example. The copper (Cu)-interconnect disposed in the copper (Cu)-interconnect layer 1900 may be annealed to the copper (Cu)-interconnect 1745 disposed in the copper (Cu)-interconnect layer 1800 in a similar fashion to the anneal described above in relation to the formation of the copper (Cu)-interconnect 1745 (FIG. 17).

Figure 20:
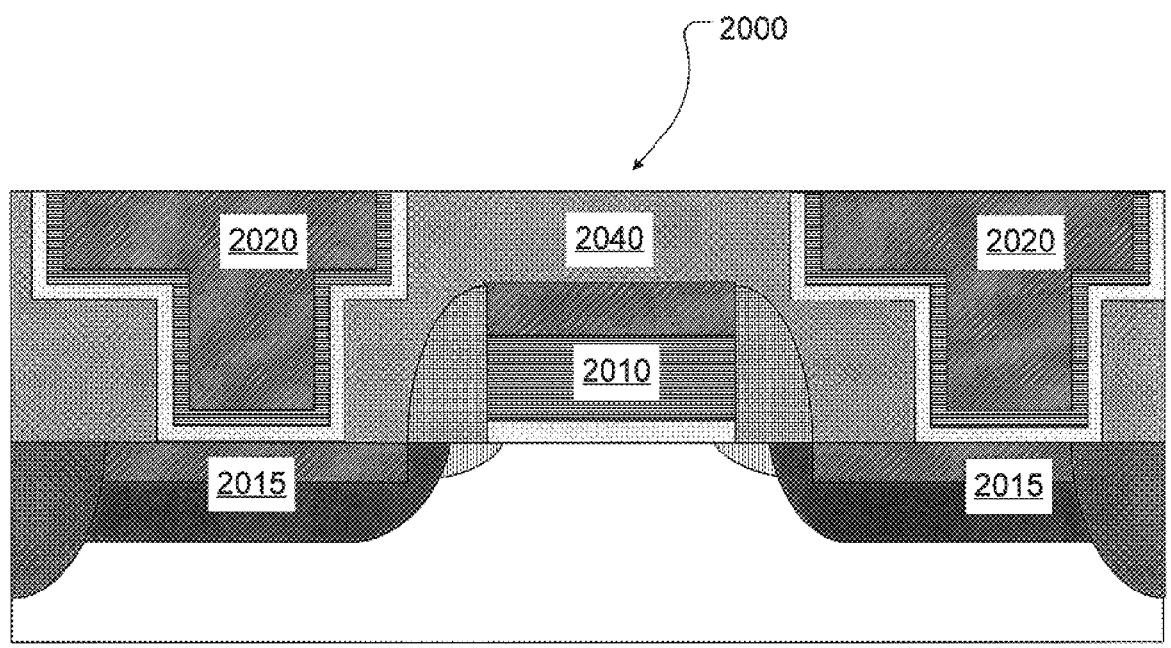
FIG. 20 schematically illustrates copper interconnects according to various embodiments of the present invention connecting source/drain regions of an MOS transistor.

As shown in FIG. 20, an MOS transistor 2010 may be an underlying structure layer (similar to the structure 1100) to a copper (Cu)-interconnect layer 2000. The copper (Cu)-interconnect layer 2000 may include copper (Cu)-filled trenches and vias 2020 adjacent a planarized dielectric layer 2040. The copper (Cu)-filled trenches and vias 2020 may be annealed to an underlying conductive structure such as source/drain regions 2015 of the MOS transistor 2010 in a similar fashion to the anneal described above in relation to the formation of the copper (Cu)-interconnect 1745 (FIG. 17).

The dual-damascene copper process flow according to various embodiments of the present invention, as shown in FIGS. 11–18, combines the intermetal via connection formation with the copper (Cu) trench-fill formation by etching a more complex pattern before the formation of the barrier metal layer and copper (Cu) seed layer and before the copper (Cu) trench-fill. The trench etching continues until the via hole (such as the first opening 1220 in FIG. 12) has been etched out. The rest of the dual-damascene copper process flow according to various embodiments of the present invention, as shown in FIGS. 13–18, is essentially identical with the corresponding single-damascene copper process flow according to various embodiments of the present invention, as shown in FIGS. 3–8. Overall, however, the dual-damascene copper process flow according to various embodiments of the present invention significantly reduces the number of processing steps and is a preferred method of achieving Cu-metallization.

Any of the above-disclosed embodiments of a method of forming a copper (Cu) interconnect or line enables a copper (Cu) interconnect or line to be formed using conventional damascene techniques in conjunction with a post-formation anneal that produces a copper (Cu) interconnect or line that is far more robust than the conventional copper (Cu) interconnect or line typically formed using in conventional damascene techniques without the post-formation anneal. Any of the above-disclosed embodiments of a method of forming a copper (Cu) interconnect or line enables lower mechanical stress levels in the copper (Cu) interconnects and lines, and, consequently, will (1) reduce the formation of stress-induced voids, and (2) increase the reliability of the copper (Cu) interconnects and lines. Lowering the mechanical stress levels in the copper (Cu) interconnects and lines reduces the likelihood of forming stress-induced voids, provides a new function, improves device density, increases device operating speed, and increases the reliability of the copper (Cu) interconnects and lines. Any of the above-disclosed embodiments of a method of forming a copper (Cu) interconnect or line demonstrate a paradigm shift in controlling mechanical stress in metallic interconnects and lines. For aluminum (Al) interconnects and lines, conventional techniques control the mechanical stresses by controlling the interlevel (or interlayer) dielectric deposition temperature. By way of contrast, any of the above-disclosed embodiments of a method of forming a copper (Cu) interconnect or line illustrate control and reduction of the mechanical stresses by controlling the post-formation anneal temperature.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below. Accordingly, the protection sought herein is as set forth in the claims below.

What is claimed:

1. A method comprising:

forming a first dielectric layer above a first structure layer;

forming a first opening in the first dielectric layer;

forming a first copper structure above the first dielectric layer and in the first opening; and annealing the first copper structure using one of a furnace anneal process performed at a temperature ranging from approximately 100–400° C. for a time ranging from approximately 10–90 minutes and a rapid thermal anneal (RTA) process performed at a temperature ranging from approximately 100–400° C. for a time ranging from approximately 10–180 seconds, wherein annealing the first copper structure comprises annealing the first copper structure using one of a furnace anneal process performed at a temperature ranging from approximately 250–350° C. for a time ranging from approximately 10–90 minutes and a rapid thermal anneal (RTA) process performed at a temperature ranging from approximately 250–350° C. for a time ranging from approximately 10–180 seconds.

2. The method of claim 1, further comprising:

forming a second dielectric layer above a second structure layer, the first structure layer comprising the second structure layer;

forming a second opening in the second dielectric layer;

forming a second copper structure in the second opening, the second copper structure below at least a portion of the first copper structure; and forming a copper interconnect by annealing the second copper structure and the first copper structure, wherein forming the first dielectric layer comprises forming the first dielectric layer above the second dielectric layer and above the second copper structure.

3. The method of claim 2, further comprising:

planarizing the first dielectric layer, wherein forming the first dielectric layer comprises forming the first dielectric layer using a low dielectric constant (low K) dielectric material, having a dielectric constant K of at most about four.

4. The method of claim 3, further comprising:

forming and patterning a mask layer above the first dielectric layer to have a mask layer opening above at least a portion of the first copper structure.

5. The method of claim 1, wherein forming the first and second dielectric layers comprises forming the first and second dielectric layers using a dielectric material having a dielectric constant K of at most about four, and forming the first and second dielectric layers using at least one of a chemical vapor deposition (CVD) process, a low-pressure CVD (LPCVD) process, a plasma-enhanced CVD (PECVD) process, a sputtering process, a physical vapor deposition (PVD) process, and a spin-on coating process.

6. The method of claim 1, wherein forming the first opening in the first dielectric layer comprises forming the first opening in the first dielectric layer using one of a mask of photoresist and an etch stop layer, the one of the mask of photoresist and the etch stop layer being formed and patterned above the first dielectric layer.

7. The method of claim 6, wherein using the one of the mask of photoresist and the etch stop layer comprises using the etch stop layer being formed of silicon nitride.

8. The method of claim 1, wherein forming the first copper structure comprises forming the first copper structure using electrochemical deposition of copper.

9. The method of claim 8, wherein using the electrochemical deposition of the copper comprises forming at least one barrier layer and a copper seed layer in the first opening before the electrochemical deposition of the copper, and planarizing the copper using chemical mechanical polishing after the anneal of the copper.

10. A method comprising:

forming a first dielectric layer above a structure layer;

forming a first opening in the first dielectric layer;

forming a first copper layer above the first dielectric layer and in the first opening;

annealing the first copper layer using one of a furnace anneal process performed at a temperature ranging from approximately 100–400° C. for a time ranging from approximately 10–90 minutes and a rapid thermal anneal (RTA) process performed at a temperature ranging from approximately 100–400° C. for a time ranging from approximately 10–180 seconds;

forming a copper structure by removing portions of the first copper layer above the first dielectric layer, leaving the copper structure in the first opening;

forming a second dielectric layer above the first dielectric layer and above the copper structure;

forming a second opening in the second dielectric layer above at least a portion of the copper structure;

forming a second copper layer above the second dielectric layer and in the second opening, the second copper layer above the at least the portion of the copper structure; and annealing the second copper layer using one of a furnace anneal process performed at a temperature ranging from approximately 100–400° C. for a time ranging from approximately 10–90 minutes and a rapid thermal anneal (RTA) process performed at a temperature ranging from approximately 100–400° C. for a time ranging from approximately 10–180 seconds.

11. The method of claim 10, further comprising:

forming a copper interconnect by removing portions of the second copper layer above the second dielectric layer, leaving the copper interconnect in the second opening; and annealing the copper interconnect to the copper structure.

12. The method of claimed 11, further comprising:

planarizing the second dielectric layer, wherein forming the second dielectric layer comprises forming the second dielectric layer using a low dielectric constant (low K) dielectric material, having a dielectric constant K of at most about four.

13. The method of claim 12, further comprising:

forming and patterning a mask layer above the second dielectric layer to have a mask layer opening above at least a portion of the copper interconnect.

14. The method of claim 10, wherein forming the first dielectric layer comprises forming the first dielectric layer using a dielectric material having a dielectric constant K of at most about four, and forming the first and second dielectric layers using at least one of a chemical vapor deposition (CVD) process, a low-pressure CVD (LPCVD) process, a plasma-enhanced CVD (PECVD) process, a sputtering process, a physical vapor deposition (PVD) process, and a spin-on coating process.

15. The method of claim 10, wherein annealing the first and second copper layers comprises annealing the first and second copper layers using one of a furnace anneal process performed at a temperature ranging from approximately 250–350° C. for a time ranging from approximately 10–90 minutes and a rapid thermal anneal (ETA) process performed at a temperature ranging from approximately 250–350° C. for a time ranging from approximately 10–180 seconds.

16. The method of claim 10, wherein forming the second opening in the second dielectric layer comprises forming the second opening in the second dielectric layer using one of a mask of photoresist and an etch stop layer, the one of the mask of photoresist and the etch stop layer being formed and patterned above the second dielectric layer.

17. The method of claim 16, wherein using the one of the mask of photoresist and the etch stop layer comprises using the etch stop layer being formed of silicon nitride.

18. The method of claim 10, wherein forming the second copper layer comprises forming the second copper layer using electrochemical deposition of copper.

19. The method of claim 18, wherein using the electrochemical deposition of the copper comprises forming at least one barrier layer and a copper seed layer in the second opening before the electrochemical deposition of the copper, and removing portions of the second copper layer comprises planarizing the copper material using chemical mechanical polishing after the anneal of the second copper layer.

20. A method of forming a copper interconnect, the method comprising:

forming a first dielectric layer above a structure layer;

forming a first opening in the first dielectric layer;

forming a copper-containing via in the first opening;

forming a second dielectric layer above the first dielectric layer and above the copper-containing via;

forming a second opening in the second dielectric layer above at least a portion of the copper-containing via; and forming a copper layer above the second dielectric layer and in the second opening, the copper layer above the at least the portion of the copper-containing via; and annealing the copper layer using one of a furnace anneal process performed at a temperature ranging from approximately 100–400° C. for a time ranging from approximately 10–90 minutes and a rapid thermal anneal (RTA) process performed at a temperature ranging from approximately 100–400° C. for a time ranging from approximately 10–180 seconds.

21. The method of claim 20, further comprising:

forming a copper line in the second opening by removing portions of the annealed copper layer; and forming the copper interconnect by annealing the copper line and the copper-containing via.

22. The method of claim 21, further comprising:

planarizing the second dielectric layer, wherein forming the second dielectric layer comprises forming the second dielectric layer using a low dielectric constant (low K) dielectric material, having a dielectric constant K of at most about four.

23. The method of claim 22, further comprising:

forming and patterning a mask layer above the second dielectric layer to have a mask layer opening above at least a portion of the copper interconnect.

24. The method of claim 20, wherein forming the first dielectric layer comprises forming the first dielectric layer using a dielectric material having a dielectric constant K of at most about four, and forming the first and second dielectric layers using at least one of a chemical vapor deposition (CVD) process, a low-pressure CVD (LPCVD) process, a plasma-enhanced CVD (PECVD) process, a sputtering process, a physical vapor deposition (PVD) process, and a spin-on coating process.

25. The method of claim 20, wherein annealing the copper layer comprises annealing the copper layer using one of a furnace anneal process performed at a temperature ranging from approximately 250–350° C. for a time ranging from approximately 10–90 minutes and a rapid thermal anneal (RTA) process performed at a temperature ranging from approximately 250–350° C. for a time ranging from approximately 10–180 seconds.

26. The method of claim 20, wherein forming the second opening in the second dielectric layer comprises forming the second opening in the second dielectric layer using one of a mask of photoresist and an etch stop layer, the one of the mask of photoresist and the etch stop layer being formed and patterned above the second dielectric layer.

27. The method of claim 26, wherein using the one of the mask of photoresist and the etch stop layer comprises using the etch stop layer being formed of silicon nitride.

28. The method of claim 20, wherein forming the copper layer comprises forming the copper layer using electrochemical deposition of copper.

29. The method of claim 28, wherein using the electrochemical deposition of the copper comprises forming at least one barrier layer and a copper seed layer in the second opening before the electrochemical deposition of the copper, and planarizing the copper using chemical mechanical polishing after the anneal of the copper layer.

30. A method of forming a copper interconnect, the method comprising:

forming a first dielectric layer above a structure layer;

forming a first opening in the first dielectric layer;

forming a first copper layer above the first dielectric layer and in the first opening;

annealing the first copper layer using one of a furnace anneal process performed at a temperature ranging from approximately 100–400° C. for a time ranging from approximately 10–90 minutes and a rapid thermal anneal (RTA) process performed at a temperature ranging from approximately 100–400° C. for a time ranging from approximately 10–180 seconds;

forming a copper-containing via by removing portions of the first copper layer above the first dielectric layer, leaving the copper-containing via in the first opening;

forming a second dielectric layer above the first dielectric layer and above the copper-containing via;

forming a second opening in the second dielectric layer above at least a portion of the copper-containing via;

forming a second copper layer above the second dielectric layer and in the second opening, the second copper layer above the at least the portion of the copper-containing via; and annealing the second copper layer using one of a furnace anneal process performed at a temperature ranging from approximately 100–400° C. for a time ranging from approximately 10–90 minutes and a rapid thermal anneal (RTA) process performed at a temperature ranging from approximately 100–400° C. for a time ranging from approximately 10–180 seconds.

31. The method of claim 30, further comprising:

forming the copper interconnect by removing portions of the second copper layer above the second dielectric layer, leaving the copper interconnect in the second opening; and annealing the copper interconnect.

32. The method of claim 31, further comprising:

planarizing the second dielectric layer, wherein forming the second dielectric layer comprises forming the second dielectric layer using a low dielectric constant (low K) dielectric material, having a dielectric constant K of at most about four.

33. The method of claim 32, further comprising:

forming and patterning a mask layer above the second dielectric layer to have a mask layer opening above at least a portion of the copper interconnect.

34. The method of claim 30, wherein forming the first dielectric layer comprises forming the first dielectric layer using a dielectric material having a dielectric constant K of at most about four, and forming the first and second dielectric layers using at least one of a chemical vapor deposition (CVD) process, a low-pressure CVD (LPCVD) process, a plasma-enhanced CVD (PECVD) process, a sputtering process, a physical vapor deposition (PVD) process, and a spin-on coating process.

35. The method of claim 30, wherein annealing the first and second copper layers comprises annealing the first and second copper layers using one of a furnace anneal process performed at a temperature ranging from approximately 250–350° C. for a time ranging from approximately 10–90 minutes and a rapid thermal anneal (RTA) process performed at a temperature ranging from approximately 250–350° C. for a time ranging from approximately 10–180 seconds.

36. The method of claim 30, wherein forming the second opening in the second dielectric layer comprises forming the second opening in the second dielectric layer using one of a mask of photoresist and an etch stop layer, the one of the mask of photoresist and the etch stop layer being formed and patterned above the second dielectric layer.

37. The method of claim 36, wherein using the one of the mask of photoresist and the etch stop layer comprises using the etch stop layer being formed of silicon nitride.

38. The method of claim 30, wherein forming the second copper layer comprises forming the second copper layer using electrochemical deposition of copper.

39. The method of claim 38, wherein using the electrochemical deposition of the copper comprises forming at least one barrier layer and a copper seed layer in the second opening before the electrochemical deposition of the copper, and removing portions of the second copper layer comprises planarizing the copper using chemical mechanical polishing after the anneal of the second copper layer.

* * * * *